(12) United States Patent
Kunihiro et al.

(10) Patent No.: US 8,451,054 B2
(45) Date of Patent: May 28, 2013

(54) POWER AMPLIFYING DEVICES

(75) Inventors: Kazuaki Kunihiro, Tokyo (JP); Shingo Yamanouchi, Tokyo (JP); Kazumi Shiikuma, Tokyo (JP)

(73) Assignee: NEC Corporation, Tokyo (JP)

( * ) Notice: Subject to any disclaimer, the term of this patent is extended or adjusted under 35 U.S.C. 154(b) by 54 days.

(21) Appl. No.: 13/133,102

(22) PCT Filed: Dec. 16, 2009

(86) PCT No.: PCT/JP2009/070949
§ 371 (c)(1),
(2), (4) Date: Jun. 6, 2011

(87) PCT Pub. No.: WO2010/073941
PCT Pub. Date: Jul. 1, 2010

(65) Prior Publication Data
US 2011/0241775 A1 Oct. 6, 2011

(30) Foreign Application Priority Data

Dec. 25, 2008 (JP) ................. 2008-330709

(51) Int. Cl.
*H03G 3/20* (2006.01)

(52) U.S. Cl.
USPC ........................................ 330/136

(58) Field of Classification Search
USPC ............................... 330/136, 297
See application file for complete search history.

(56) References Cited

U.S. PATENT DOCUMENTS

| | | | |
|---|---|---|---|
| 5,973,556 A | 10/1999 | Su | |
| 6,710,646 B1 | 3/2004 | Kimball | |
| 7,949,316 B2 * | 5/2011 | Takinami et al. | 455/127.1 |
| 2005/0152160 A1 | 7/2005 | Fung et al. | |
| 2007/0249304 A1 | 10/2007 | Snelgrove | |
| 2008/0272750 A1 | 11/2008 | Aitto-Oja | |

FOREIGN PATENT DOCUMENTS

| | | |
|---|---|---|
| JP | 58-123210 A | 7/1983 |
| JP | 3-198512 A | 8/1991 |
| JP | 3077285 B | 5/2001 |
| JP | 3207153 B | 9/2001 |
| JP | 2003526980 A | 9/2003 |
| JP | 2004260509 A | 9/2004 |

(Continued)

OTHER PUBLICATIONS

International Search Report for PCT/JP2009/070949 mailed Jan. 26, 2010.

(Continued)

*Primary Examiner* — Robert Pascal
*Assistant Examiner* — Khiem Nguyen

(57) ABSTRACT

A radio frequency amplifier amplifies a modulation signal or its phase modulation component and outputs the resultant signal. A linear amplifier adds an output voltage to a power supply voltage supplied to the radio frequency amplifier, amplifies a difference between the output voltage and the amplitude modulation component, and outputs the resultant difference. A control signal generation section detects a direction in which an output current of the linear amplifying section flows and generates a pulse modulation signal according to the direction of the current. A switching amplifying section controls connection and disconnection of a DC current based on the pulse modulation signal as a control signal so as to perform switching amplification for an output signal of the linear amplifying section, add the resultant signal to a predetermined DC voltage, and supply the resultant signal as the power supply voltage to the radio frequency amplifier. The DC current and the predetermined DC voltage are supplied to the switching amplifying section.

17 Claims, 15 Drawing Sheets

FOREIGN PATENT DOCUMENTS

| | | |
|---|---|---|
| JP | 2007104651 A | 4/2007 |
| JP | 2008061123 A | 3/2008 |
| WO | 03103134 A | 12/2003 |
| WO | 2006114792 A | 11/2006 |
| WO | 2008032264 A2 | 3/2008 |

OTHER PUBLICATIONS

L. R. Kahn, "Single-Sideband Transmission by Envelope Elimination and Restoration", Proceedings of the I.R.E., vol. 40, 1952, pp. 803-806.

J. Staudinger et al., "High Efficiency CDMA RF Power Amplifier Using Dynamic Envelope Tracking Technique", 2000 IEEE MTT-S Digest, WE3A-6, vol. 2, 2000, pp. 873-876.

F. Wang et al., "Envelope Tracking Power Amplifier with Pre-Distortion Linearization for WLAN 802.11g", 2004 IEEE MTT-S Digest, TH3B-8, vol. 3, 2004, pp. 1543-1546.

The extended European search report for PCT/JP200907949 dated on Jun. 6, 2012.

\* cited by examiner

POWER AMPLIFYING DEVICES

TECHNICAL FIELD

The present invention relates to power amplifying devices mainly used for a radio communication transmitter, in particular, to those that can vary a power supply voltage supplied to an amplifier on the basis of an amplitude modulation component of an input signal.

BACKGROUND ART

Radio communication systems such as mobile telephone systems and wireless LANs (Local Area Networks) that have appeared in recent years use modulation formats such as QPSK (Quadrature Phase Shift Keying) and multi-value QAM (Quadrature Amplitude Modulation). In these modulation formats, when a signal changes between symbols, since its waveform is involved in amplitude modulation, the amplitude (envelop) of a radio frequency modulation signal superimposed with a carrier signal of a microwave bandwidth varies with time. The ratio of the peak power and the average power of the radio frequency modulation signal is referred to as PAPR (Peak-to-Average Power Ratio). When a signal having a large PAPR is amplified with a high linearity maintained, a power supply device needs to supply sufficiently large power to an amplifier so as to prevent the waveform of the amplified signal from being distorted with peak power and to secure high linearity of the amplified signal. In other words, the amplifier needs to be operated in a back-off power region that is sufficiently lower than the saturated output power restricted by the power supply volte.

Generally, since radio frequency amplifiers that amplify a radio frequency signal according to the class A system or class AB system have a maximum efficiency that is nearly at the saturated output power level, if they are operated in the large back-off power region, their average efficiency lowers.

Although the OFDM (Orthogonal Frequency Division Multiplexing) system has been used in the next-generation mobile phone systems, wireless LANs, digital television broadcasts and so forth, since their PAPR tends to increase, the average efficiency of radio frequency amplifiers further lowers. Thus, it is desired that radio frequency amplifiers operate with high efficiency even in the large back-off power region.

As a system that amplifies a signal in the back-off region and with wide dynamic range and high efficiency, a power amplifying device referred to as the EER (Envelope Elimination and Restoration) system has been proposed in Non-patent Document 1.

The EER system proposed in Non-patent Document 1 divides an input modulation signal into a phase modulation component and an amplitude modulation component. Thereafter, the phase modulation component with a constant amplitude is inputted to the amplifier in such a manner that phase modulation information is maintained. At this point, the amplifier is always operated at nearly the saturated output power level that provides the maximum efficiency.

On the other hand, the amplitude modulation component is amplified with high efficiency by a class D amplifier or the like in such a manner that amplitude modulation information is maintained and then supplied as a power supply voltage whose output intensity has been modulated (modulation power supply).

When the power amplifying device is operated in such a manner, the radio frequency device is also operated as a multiplier and combines the phase modulation component and amplitude modulation component of the modulation signal and outputs the combined result. Thus, the radio frequency amplifier can obtain an output modulation signal amplified with high efficiency not in the large back-off power region.

As a system similar to the EER system, the so-called ET (Envelop Tracking) system is also known. This system has been reported for example in Non-patent Document 2 and so forth.

The ET system and the EER system have the same structure that uses a class D amplifier or the like that amplifies the amplitude modulation component of the modulation signal in such a manner that the amplification modulation information is maintained and supplies the resultant signal as a power supply voltage (modulation power supply) whose output intensity has been modulated to the amplifier.

The EER system and the ET system have the same structure except that, in the EER system, the former inputs only a phase modulation signal with a constant amplitude to the amplifier so as to operate it at nearly a saturation output power level; in the ET system, while the latter inputs an input modulation signal containing both amplitude modulation component and phase modulation component to the amplifier so as to linearly operate it.

Although the ET system is inferior to the EER system in efficiency because the amplifier of the former operates linearly, since only bare minimum power based on the amplitude modulation component of the input modulation signal is supplied to the amplifier, the former can have higher efficiency than the structure that supplies a constant power voltage to the amplifier.

In addition, the ET system can be more easily realized than the EER system because the former allows a timing margin at which the amplitude modulation component and the phase modulation component to be combined to be loose.

The EER system and the ET system generally use a modulation power supply that converts the amplitude modulation component into a pulse modulation signal and performs switching amplification for the pulse modulation signal using a class D amplifier or the like. As a pulse modulation system for the EER and the ET system, the PWM (Pulse Width Modulation) system has been traditionally used; however, Patent Document 1 and Patent Document 2 propose structures that use the delta modulation system (or PDM (Pulse Density Modulation) that has higher linearity than the foregoing systems. Moreover, in recent years, the sigma delta modulation system and so forth that have a high SNR (Signal to Noise Ratio) have been used as pulse modulation systems.

Relevant standards for radio communication systems such as mobile telephone systems and wireless LANs using digital modulation systems that have appeared in recent years require that ACPR (Adjacent Channel Leakage Power Ratio) and EVM (Error Vector Magnitude) should be suppressed to a predetermined constant value or below.

To satisfy these standards for power amplifying devices according to the EER system and ET system, it is said that the bandwidth in which a pulse modulator and a class D amplifier with which a modulation power supply is provided needs to be at least twice the bandwidth of a modulation signal. For example, the modulation bandwidth of WCDMA (Wideband Code Division Multiple Access) used in mobile phone systems is around 5 MHz, whereas the modulation bandwidth of IEEE 802.11a/g used in wireless LANs is around 20 MHz. Generally, it is difficult to switch a large power at high speed and realize a modulation power supply that operates in such a wide bandwidth.

A power amplifying device provided with a modulation power supply having the simplest structure has been proposed in Patent Document 3. FIG. 1 shows a structure of a power amplifying device presented in Patent Document 3 (this device is hereinafter referred to as the first related art reference).

The power amplifying device according to the first related art reference has a structure that supplies an average power (power supply voltage) to an amplifier in an ordinary state and supplies a large power (power supply voltage) to the amplifier only when the amplitude value reaches a constant value or greater.

With reference to FIG. 1 and FIG. 2, an operation of the power amplifying device according to the first related art reference will be described.

The power amplifying device according to the first related art reference ordinarily supplies voltage Bc as a power supply voltage to amplifier 204 (refer to FIG. 2 (c)).

Voltage Bc is ordinarily designated to be lower than the maximum output voltage so as to obtain an average output power. When envelop sensor 201 detects a peak at which envelop (amplitude modulation component) 9 of the input modulation signal becomes greater than reference voltage Vref (FIG. 2 (a)), envelop sensor 201 outputs control signal 10 (FIG. 2 (b)).

Power bulb 203 is turned on based on control signal 10 and then voltage 11 to which maximum voltage Bv has been added is applied to amplifier 204 (FIG. 2 c). The power bulb having a structure using capacitance coupling has been proposed in Patent Document 4; a bulb having a structure using both capacitance coupling and magnetic coupling has been proposed in Patent Document 5.

Since these structures do not allow wasteful power to be supplied to amplifier 204 in a region where the amplitude modulation component of the modulation signal is small, the average efficiency of amplifier 204 can be improved.

Another structure of a modulation power supply that operates with high efficiency and a wide bandwidth has been proposed in Non-patent Document 3. The structure of the power amplifying device proposed in Non-patent Document 3 (this device is hereinafter referred to as the second related art reference) is shown in FIG. 3.

The power amplifying device according to the second related art reference interlocks linear amplifying section 3 that operates in a wide bandwidth, but with low efficiency and switching regulator section 2 that operates in a narrow bandwidth, but with high efficiency so as to supply modulation power (power supply voltage) 11 with high efficiency in a wide bandwidth to amplifier 1. With reference to FIG. 4, a specific operation of the power amplifying device will be described.

Inputted to linear amplifying section 3 that is composed of a differential amplifier and that operates as a voltage follower is amplitude signal 9 that is the amplitude modulation component of modulation signal 8. In this example, it is assumed that amplitude signal 9 is a 2 MHz sine wave (FIG. 4 (c), Reference numeral 9).

An output current of linear amplifying section 3 is converted into a voltage signal by current detection resistor 42 and inputted to hysteresis comparator 41. In this example, if polarities are selected such that when the current flows from linear amplifying section 3, the output voltage of hysteresis comparator 41 becomes High and when the current flows to linear amplifying section 3, the output voltage of hysteresis comparator 41 becomes Low, a pulse width modulation signal based on the output signal of linear amplifying section 3 is outputted from hysteresis comparator 41 (FIG. 4 (c), Reference numeral 10).

Gate driver 5 turns on or off switching device 21 composed of for example an MOS FET (Metal Oxide Semiconductor Field Effect Transistor) based on the output signal of hysteresis comparator 41. Switching device 21 composes switching regulator section 2 in combination with diode 22; switching regulator section 2 amplifies the amplitude of the pulse width modulation signal to Vcc1.

The pulse width modulation signal that has been amplified is integrated by inductor 6 and thereby the switching frequency component is removed therefrom (FIG. 4 (a)).

An error component contained in an output current of inductor 6 is compensated by linear amplifying section 3 and supplied as a power supply voltage to radio frequency amplifier 1. At this point, since a current (FIG. 4 (b)) that flows in linear amplifier 31 with low efficiency contains only the error component, the power consumed in linear amplifier 31 is small and most of the signal components of amplitude signal 9 are amplified by switching regulator section 2 with high efficiency. Thus, the efficiency of the entire power amplification device can be improved.

However, since the power amplifying device according to the first related art reference of those presented above needs to operate in a large-back-off voltage region such that the output amplitude of amplifier 204 always becomes lower than modulation voltage 11 (FIG. 2 (c)), as a problem of the first related art reference, the effect of improved efficiency is low. In addition, since voltage waveform 111 that has been modulated becomes in a hard clipping shape, as a problem of the first related art reference, the output spectrum deteriorates.

On the other hand, in the power amplifying device according to the second related art reference, since linear amplifier 31 compensates the voltage in such a manner that voltage waveform 11 supplied to radio frequency amplifier 1 becomes close to the waveform of amplitude signal 9, the power amplifying device according to the second related art reference improves the efficiency and suppresses deterioration of the spectrum in comparison with the power amplifying device according to the first related art reference.

However, if the power amplifying device according to the second related art reference is used for a device having a high transmission power such as a radio base station of a mobile phone system, since power supply voltage Vcc1 becomes around 28V, in order to turn on switching device (ordinarily, an FET) 21, it is necessary to raise the amplitude of output signal 10 of gate driver 5 to Vcc1 or greater. Such a structure can be ordinarily accomplished by using a boot strap circuit or the like for gate driver 5, and generally it is difficult to operate such pulses having a large amplitude at high speed.

Thus, in the power amplifying device according to the second related art reference, as shown in FIG. 4 (c), the switching frequency is restricted to a low value and thereby switching regulator section 2 can amplify only signal components in a bandwidth from DC to around 100 kHz. Thus, since signal components in higher bandwidths are amplified only by linear amplifier 31 with low efficiency, as a problem of the second related art reference, the efficiency of the entire power amplifying device deteriorates.

Moreover, in the systems that modulate a power supply voltage of an amplifier such as the foregoing EER system and ET system, when the value of the power supply voltage (voltage waveform 11) that is supplied from the modulation power supply to amplifier 1 gets close to 0, since the gain of the amplifier becomes small, as a problem of the second related art reference, the waveform of output signal 12 distorts. Thus, it is preferred that the output voltage of the modulation power supply be designated a constant lower limit value (DC offset).

In the power amplifying device according to the second related art reference, although switching regulator section 2 amplifies a signal including a DC offset, if it operates with a large power in a high speed switching state, it is difficult to allow the switching regulator to obtain an efficiency of 90% or greater.

CITATION LIST

Patent Document

[Patent Document 1] Japanese Patent Laid-Open No. 3207153, (Page 8, FIG. 3)
[Patent Document 2] U.S. Pat. No. 5,973,556, (Page 3, FIG. 3)
[Patent Document 3] Japanese Patent Laid-Open No. 2003-526980, (Page 30, FIG. 2A)
[Patent Document 4] WO03/103134, (Page 2, FIG. 2)
[Patent Document 5] WO2006/114792, (Page 3, FIG. 3)

Non-Patent Document

[Non-patent Document 1] Lenard R. Kahn, "Single-sideband Transmission by Envelope Elimination and Restoration", PROCEEDINGS OF THE I. R. E., Vol. 40, pp. 803-806, 1952.
[Non-patent Document 2] J. Staudinger, B. Gilsdorf, D. Newman, G. Norris, G. Sandwniczak, R. Sherman and T. Quach, "HIGH EFFICIENCY CDMA RF POWER AMPLIFIER USING DYNAMIC ENVELOPE TRACKING TECHNIQUE", 2000 IEEE MTT-S Digest, vol. 2, pp. 873-876.
[Non-patent Document 3] F. Wang, A. Ojo, D. Kimball, P Asbeck and L. Larson, "Envelope Tracking Power Amplifier with Pre-Distortion Linearization for WLAN 802.11g", 2004 IEEE MTT-S Digest, vol. 3, pp. 1543-1546.

SUMMARY

An object of the present invention is to provide power amplifying devices that can vary a power supply voltage supplied to a radio frequency amplifier according to the amplification of a modulation signal, in particular, to those that have high efficiency and low waveform distortion.

To accomplish the foregoing object, an exemplary aspect of the power amplifying device of the present invention is a power amplifying device that amplifies a modulation signal containing an amplitude modulation component and a phase modulation component, comprising:

a radio frequency amplifier that amplifies said modulation signal and outputs the resultant signal;

a linear amplifying section that adds an output voltage to a power supply voltage supplied to said radio frequency amplifier, amplifies a difference between the output voltage and the amplitude modulation component of said modulation signal, and outputs the resultant difference;

a control signal generation section that detects a direction in which an output current of said linear amplifying section flows and generates a pulse modulation signal according to the direction of the current;

a switching amplifying section that controls connection and disconnection of a DC current based on said pulse modulation signal as a control signal so as to perform switching amplification for an output signal of said linear amplifying section, to add the resultant signal to a predetermined DC voltage, and to supply the resultant signal as said power supply voltage to said radio frequency amplifier;

a first DC power supply that supplies said DC current to said switching amplifying section; and a second DC power supply that supplies said predetermined DC voltage to said switching amplifying section.

Alternatively, another exemplary aspect of the power amplifying device of the present invention is a power amplifying device that amplifies a modulation signal containing an amplitude modulation component and a phase modulation component, comprising:

a radio frequency amplifier that amplifies said modulation signal and outputs the resultant signal;

a voltage waveform trimming section that forms a voltage waveform of the amplitude modulation component of said modulation signal;

a linear amplifying section that adds an output voltage to a power supply voltage supplied to said radio frequency amplifier, amplifies a difference between the output voltage and the amplitude modulation component of said modulation signal, and outputs the resultant difference;

a control signal generation section that detects a direction in which an output current of said linear amplifying section flows and generates a pulse modulation signal according to the direction of the current;

a switching amplifying section that controls connection and disconnection of a DC current based on said pulse modulation signal as a control signal so as to perform switching amplification for an output signal of said linear amplifying section, to add the resultant signal to a predetermined DC voltage, and to supply the resultant signal as said power supply voltage to said radio frequency amplifier;

a first DC power supply that supplies said DC current to said switching amplifying section; and a second DC power supply that supplies said predetermined DC voltage to said switching amplifying section.

EXEMPLARY EMBODIMENT

Next, with reference to drawings, the present invention will be described.

First Exemplary Embodiment

Figure 5:
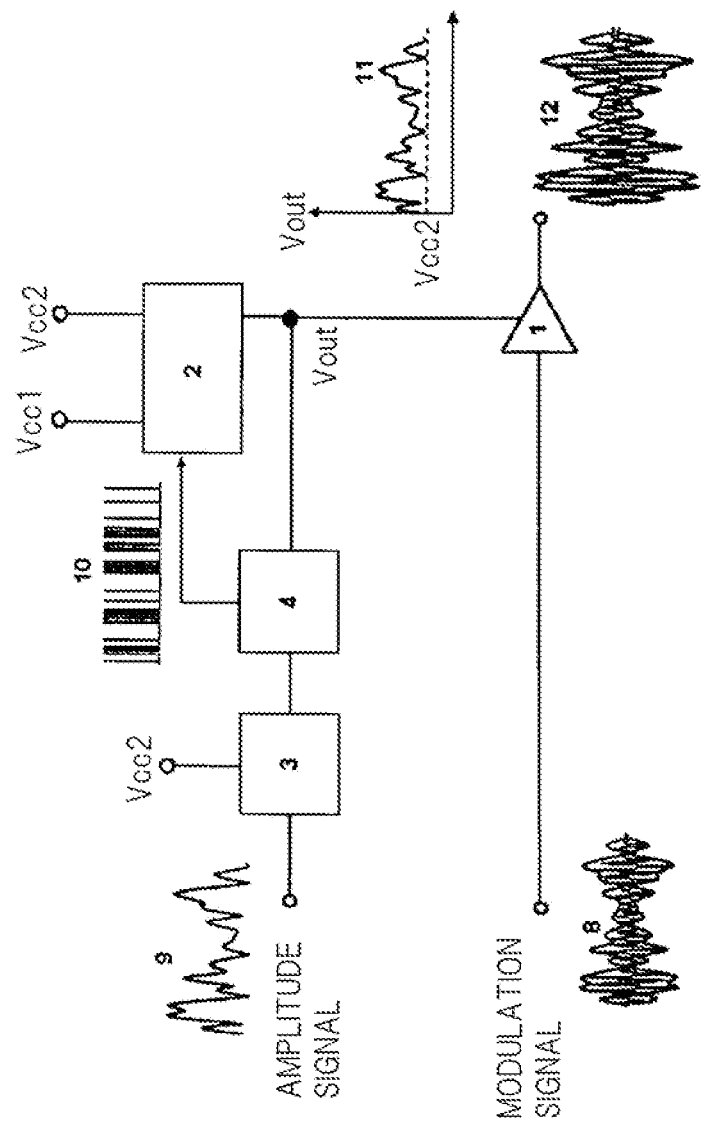
FIG. 5 is a block diagram showing a structure of a power amplifying device according to a first exemplary embodiment.

FIG. 5 is a block diagram showing a structure of a power amplifying device according to a first exemplary embodiment.

As shown in FIG. 5, the power amplifying device according to the first exemplary embodiment is provided with radio frequency amplifier 1, switching amplifying section 2, linear amplifying section 3, and control signal generation section 4.

Linear amplifying section 3 adds a predetermined DC voltage to amplitude signal 9 that is an amplitude modulation component of modulation signal 8, adds the output voltage to a power supply voltage supplied to radio frequency amplifier 1, amplifies a difference between the output voltage and the amplitude modulation component of the modulation signal, and outputs the resultant signal.

Control signal generation section 4 generates a pulse modulation signal that becomes High or Low depending on the direction of the output current of linear amplifying section 3 and outputs the pulse modulation signal to switching amplifying section 2.

Switching amplifying section 2 performs switching-amplification for amplitude signal 9 based on the pulse modulation signal as a control signal that is outputted from control signal generation section 4, adds a predetermined DC voltage to the amplified signal, and outputs the resultant signal. The output voltage of switching amplifying section 2 is added to the output voltage of control signal generation section 4 and thereby modulation voltage 11 is generated as a power supply voltage supplied to radio frequency amplifier 1.

Radio frequency amplifier 1 linearly amplifies modulation signal 8 according to the class A system or class AB system based on modulation voltage 11 as a power supply and outputs radio frequency modulation signal 12 which has been modulated with respect to amplitude and phase.

Figure 6:
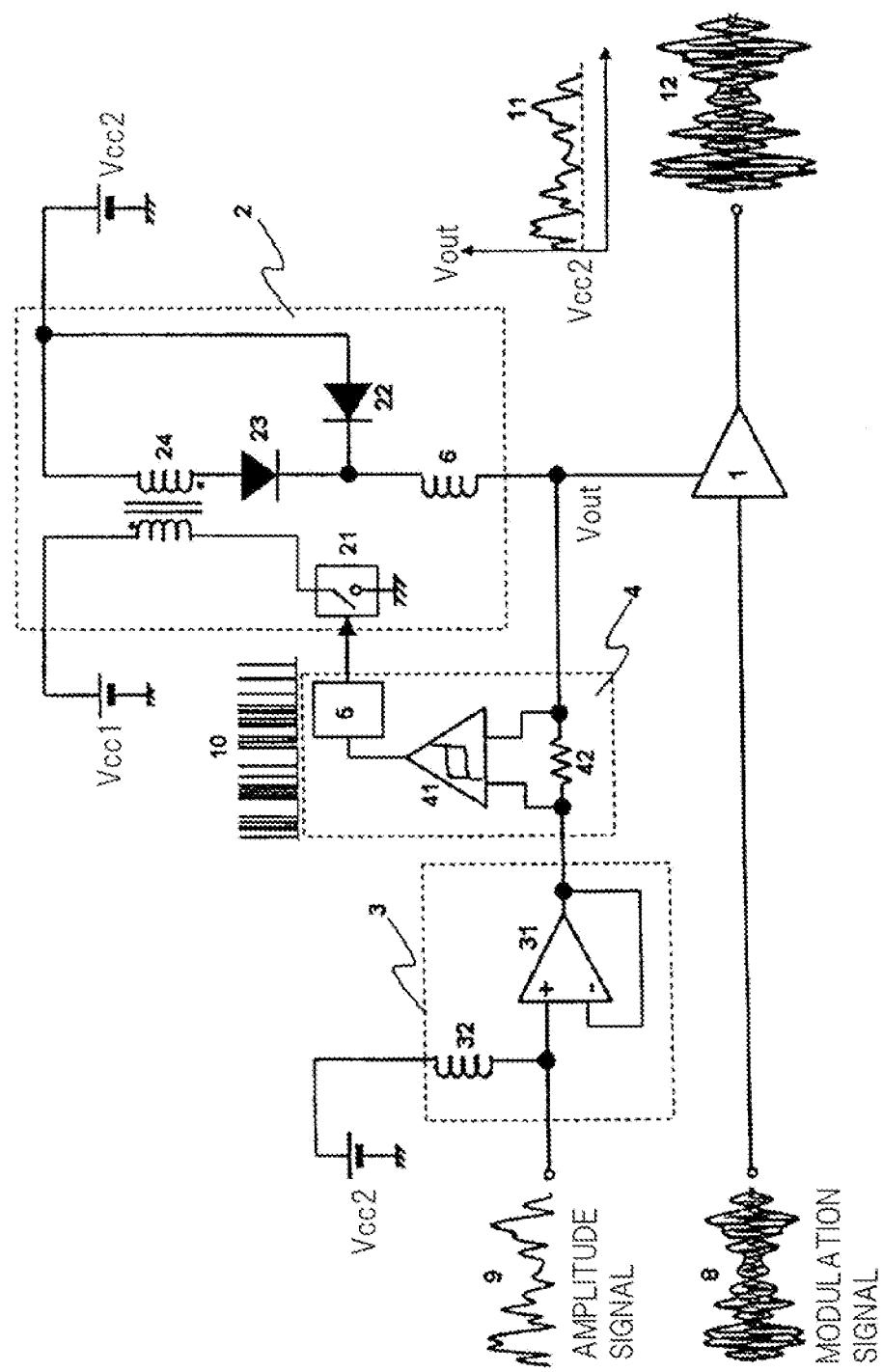
FIG. 6 is a circuit diagram showing a specific exemplary structure of the power amplifying device shown in FIG. 5.

FIG. 6 is a circuit diagram showing a specific exemplary structure of the power amplifying device shown in FIG. 5.

As shown in FIG. 6, switching amplifying section 2 is provided with switching device 21, transformer 24, diode (first rectifying device) 22, diode (second rectifying device) 23, and inductor (filter) 6.

On the other hand, linear amplifying section 3 is provided with linear amplifier 31 and choke inductor 32. Control signal generation section 4 is provided with hysteresis comparator 41, current detection resistor 42, and gate driver 5.

The power amplifying device according to this exemplary embodiment adds a DC voltage to the amplitude modulation component (amplitude signal) of the modulation signal and inputs the resultant signal to linear amplifying section 3. Linear amplifying section 3 is composed of a linear amplifier including a negative feedback loop (for example, a differential amplifier) and the waveform of the output voltage accords to the waveform of amplitude signal 9 including the DC voltage component with high accuracy. The output of linear amplifying section 3 is inputted to control signal generation section 4.

Control signal generation section 4 is provided with current detection resistor 42 that detects a current that is outputted from linear amplifying section 3 and a comparator (hysteresis comparator 41) and generates a control signal for example that becomes High when the current flows from linear amplifying section 3 and becomes Low when the current flows thereto. The generated control signal is inputted to switching amplifying section 2.

Switching amplifying section 2 controls connection/disconnection of switching device 21 to which the DC voltage has been applied through a primary winding of transformer 24 based on the control signal generated by control signal generation section 4 so as to perform switching amplification for the amplitude modulation component of the modulation signal with high efficiency. In addition, the power amplifying device according to this exemplary embodiment adds a DC voltage to the voltage waveform for which switching-amplification has been performed and outputted from a secondary winding of transformer 24 and outputs the resultant signal.

A current that is outputted from switching amplifying section 2 is smoothened by inductor 6 and added to the output signal of linear amplifying section 3 so as to compensate the voltage.

The compensated voltage is supplied as a power supply voltage to radio frequency amplifier 1 that linearly amplifies modulation signal 8, resulting in always supplying only a bare minimum power (power supply voltage) to radio frequency amplifier 1. Thus, the power amplifying device according to this exemplary embodiment can operate radio frequency amplifier 1 with higher efficiency than the case in which a constant voltage is supplied as a power supply voltage.

Since the power amplifying devices according to the related art references use a pulse signal that drives switching device 21 composed of an FET and that has a higher amplitude than does the power supply voltage, it is difficult to operate the power amplifying device at high speed. This mainly causes the switching frequency to become low, a large power load to be imposed on linear amplifying section 3 that compensated a switching error, and thereby causes the efficiency of the entire power amplifying device to deteriorate. On the other hand, when a DC voltage is added to amplitude signal 9, since switching amplification needs to be performed for the DC voltage component, it was efficiency inevitably deteriorated to some extent. In contrast, since the power amplifying device according to this exemplary embodiment can cause an FET used as a switching device to operate on the source ground basis, the drive signal that drives the FET can be as low as several volts and perform the switching operation at high speed. Thus, since the bandwidth for the switching-amplification widens, the power consumption of linear amplifying section 3 can be suppressed and the efficiency of the entire power amplifying device can be improved.

In addition, since linear amplifying section 3 with low efficiency is used only for compensation of an error in switching amplification, the power consumption decreases.

Moreover, in order to decrease the output waveform distortion of radio frequency amplifier 1, the DC voltage component contained in the power supply voltage supplied to radio frequency amplifier 1 is directly supplied to the radio frequency amplifier through the secondary winding of the transformer, not being performed for switching amplification, the efficiency of the entire power amplifying device does not deteriorate.

As a result, the power amplifying device according to this exemplary embodiment improves efficiency of the modulation power supply in comparison with the power amplifying devices according to the related art references. In addition, since the reproduction accuracy of the waveform in the modulation power supply with which the power amplifying device, according to this exemplary embodiment, is provided finally depends on the linear amplifier, the power amplifying device according to this exemplary embodiment can accomplish a higher waveform reproduction accuracy with higher efficiency maintained than can the power amplifying devices according to the related art references. Thus, the modulation power supply according to this exemplary embodiment realizes a power amplifying device that can amplify a modulation signal that has been modulated with respect to amplitude and phase with less output waveform distortion and a high efficiency.

Next, with reference to FIG. 6 to FIG. 8, operation of the power amplifying device according to the first exemplary embodiment will be described.

Figure 7:
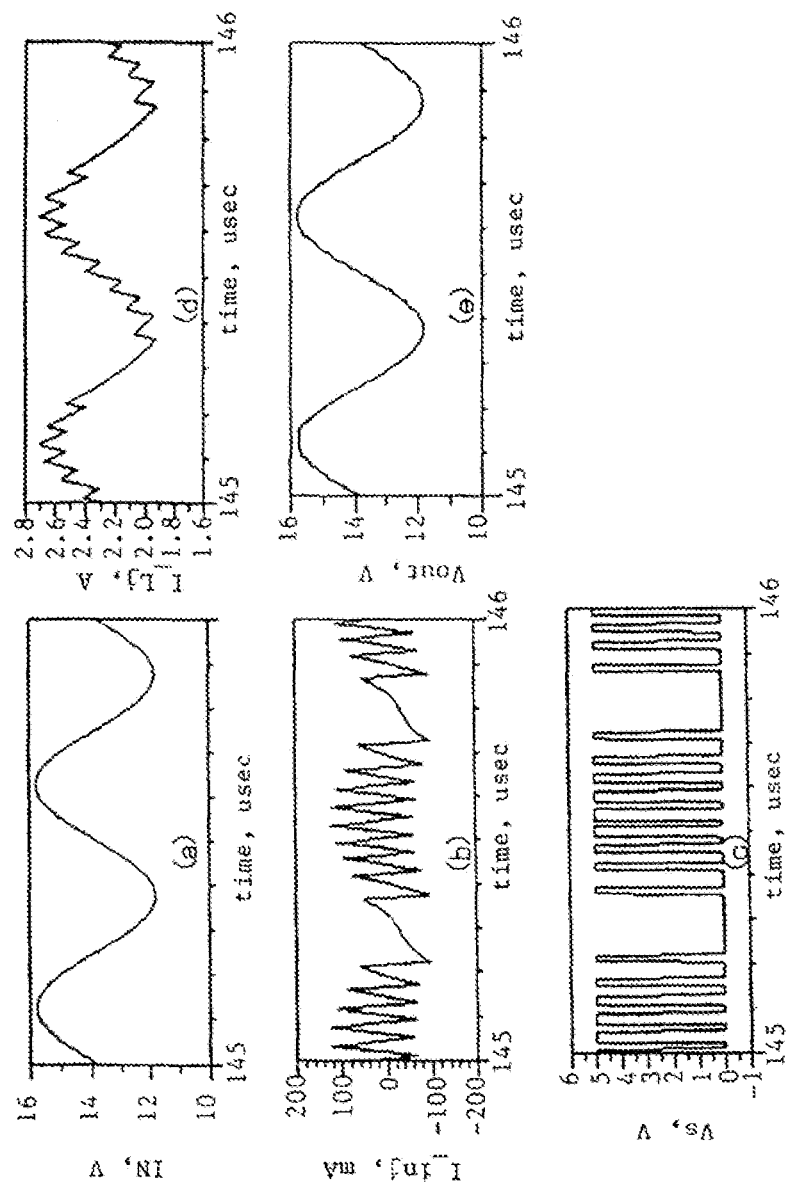
FIG. 7 is a signal waveform diagram showing an exemplary operation of the power amplifying device shown in FIG. 6.
Figure 8:
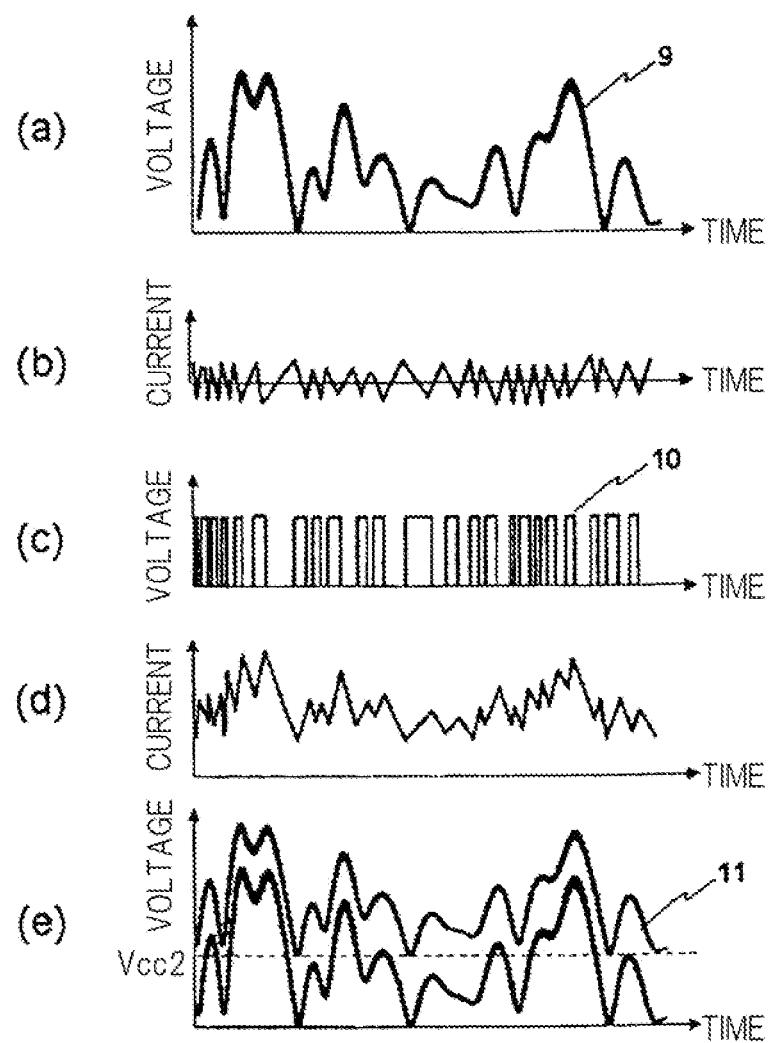
FIG. 8 is a signal waveform diagram showing an exemplary operation of the power amplifying device shown in FIG. 6.

FIG. 7 and FIG. 8 are signal waveform diagrams showing an exemplary operation of the power amplifying device shown in FIG. 6. FIG. 7 shows an exemplary operational waveform in the case in which a sine wave having an amplitude of 4V and a frequency of 2 MHz is inputted as amplitude signal 9 and a 12V DC voltage is added to amplitude signal 9 by linear amplifying section 3. On the other hand, FIG. 8 shows an exemplary operational waveform of each block in the case in which an envelop (amplitude signal) of a WCDMA downlink signal is inputted.

As shown in FIG. 6, amplitude signal 9 that is an amplitude modulation component of modulation signal 8 that has been modulated with respect to amplitude and phase is inputted to linear amplifying section 3.

A DC voltage of Vcc2=12 V is added to amplitude signal 9 through choke inductor 32 (FIG. 7 ($a$)) and then inputted to linear amplifier 31 that operates as a voltage follower composed of for example a differential amplifier.

An output current (FIG. 7 ($b$)) of linear amplifier 31 is converted into a voltage signal by current detection resistor 42 and then inputted to hysteresis comparator 41. If polarities are selected such that when the current flows from linear amplifier 31, the output voltage of hysteresis comparator 41 becomes High and when the current flows to linear amplifier 31, the output voltage of hysteresis comparator 41 becomes Low, a pulse width modulation signal corresponding to the intensity of the input signal is outputted from hysteresis comparator 41 (FIG. 7 ($c$)).

Gate driver 5 turns on or off switching device 21 composed of, for example, an MOS FET based on the output signal of hysteresis comparator 41.

One terminal of switching device 21 is grounded, whereas the other terminal is connected to first power supply Vcc1 through the primary winding of transformer 24. Switching device 21 controls connection/disconnection of a current that flows between first power supply Vcc1 and a ground potential based on the output signal of hysteresis comparator 41 so as to amplify the amplitude of the output signal of hysteresis comparator 41 to Vcc1.

In this example, since a voltage is not applied to both terminals of switching device 21 while a current is flowing, switching device 21 amplifies the output signal of hysteresis comparator 41 ideally with an efficiency of 100%.

The signal amplified by switching device 21 is transferred from the primary winding to the secondary winding of transformer 24. Since DC voltage Vcc2 generated by a second power supply has been applied to one terminal of the secondary winding of transformer 24, a signal of which DC voltage Vcc2 has been added to the pulse signal of amplitude Vcc1 is outputted from the secondary winding of transformer 24.

A current based on the pulse signal is supplied from the second power supply to the secondary winding of transformer 24. At this point, currents are outputted alternately from rectifying device 22 and rectifying device 23 depending on whether the pulse signal becomes High/Low by rectifying operations of rectifying device 22 and rectifying device 23. Since a pulse-shaped current flows in the secondary winding of transformer 24, the characteristic of switching amplification with high efficiency of switching device 21 is maintained on the secondary winding side of transformer 24. The current that is outputted from the secondary winding of transformer 24 is integrated by inductor 6 and thereby a switching frequency component is removed therefrom (FIG. 7 ($d$)).

In addition, a switching noise component contained in the output voltage of switching amplifying section 2 is compensated (smoothened) by linear amplifier 31 (FIG. 7 ($e$)).

As shown in FIG. 6, since the output signal of linear amplifier 31 is negatively fed back thereto, it operates such that the waveform of the output signal matches that of the input signal. Thus, a signal that cancels the switching noise contained in the output voltage of switching amplifying section 2 is outputted from linear amplifier 31.

Thus, the switching noise contained in the output voltage of switching amplifying section 2 is smoothened by linear amplifier 31. At this point, although an output terminal of linear amplifier 31 is connected to the output terminal of switching amplifying section 2 through current detection resistor 42, since the value of current detection resistor 42 is small, it hardly affects the voltage compensation operation.

Voltage Vout that has been compensated by linear amplifier 31 is supplied to radio frequency amplifier 1. Radio frequency amplifier 1 linearly amplifies modulation signal 8 that has been inputted based on the output voltage of switching amplifying section 2 as a power supply voltage. At this point, since a minimum power (power supply voltage) is supplied to radio frequency amplifier 1 based on the amplitude of amplitude signal 9, radio frequency amplifier 1 can always operate nearly with a saturation power having high efficiency.

On the other hand, when an envelop signal (FIG. 8 ($a$)) of a WCDMA downlink signal as amplitude signal 9 is inputted to linear amplifying section 3, it adds DC voltage Vcc2 to amplitude signal 9 through choke inductor 32 and then linear amplifier 31 that operates as a voltage follower composed of a differential amplifier linearly amplifies the resultant signal.

Like the case in which a sine wave shown in FIG. 7 is inputted, pulse width modulation signal 10 that changes to High or Low according to the direction of the output current (FIG. 8 ($b$)) of linear amplifier 31 is outputted from comparator 41 (FIG. 8 ($c$)).

Voltage 11 in which a voltage (FIG. 8 ($d$)) amplified with high efficiency by switching amplifying section 2 based on pulse width modulation signal 10 and an output voltage (FIG.

8 (b)) of linear amplifying section 3 are added and smoothened is supplied as a power supply voltage to radio frequency amplifier 1.

Radio frequency amplifier 1 linearly amplifies modulation signal 8 that has been inputted as the power supply voltage that is the output voltage of switching amplifying section 2. At this point, since only a minimum power (power supply voltage) is supplied to radio frequency amplifier 1 based on the amplitude of amplitude signal 9, radio frequency amplifier 1 can always operate nearly with a saturation power having high efficiency.

In the power amplifying device according to this exemplary embodiment, as shown in FIG. 7 (b) and FIG. 8 (b), since only a current of a switching noise component flows in linear amplifier 31 with low efficiency, it consumes a small amount of power, resulting in improving the efficiency of the entire power amplifying device.

Figure 1:
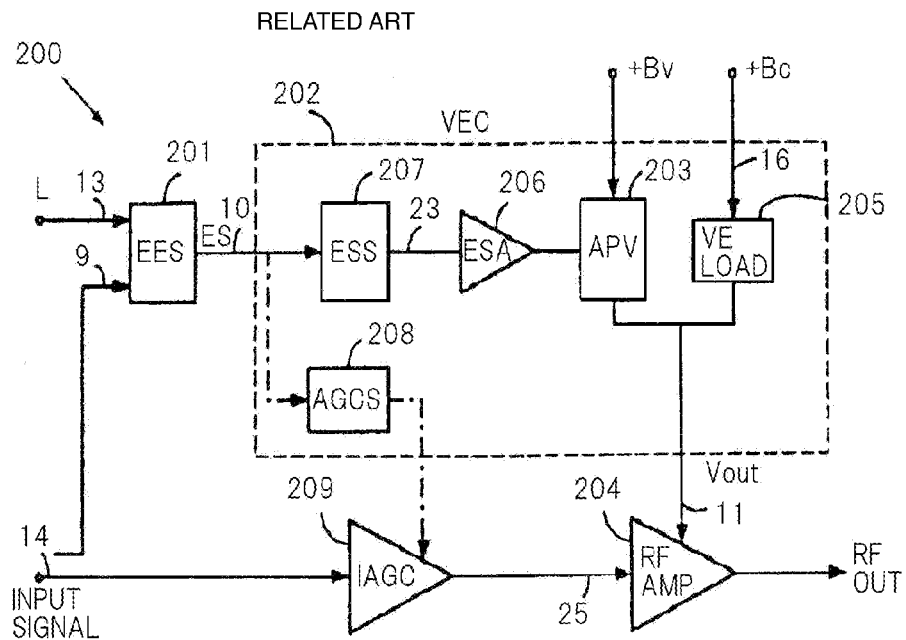
FIG. 1 is a block diagram showing a structure of a power amplifying device according to a first related art reference.
Figure 2:
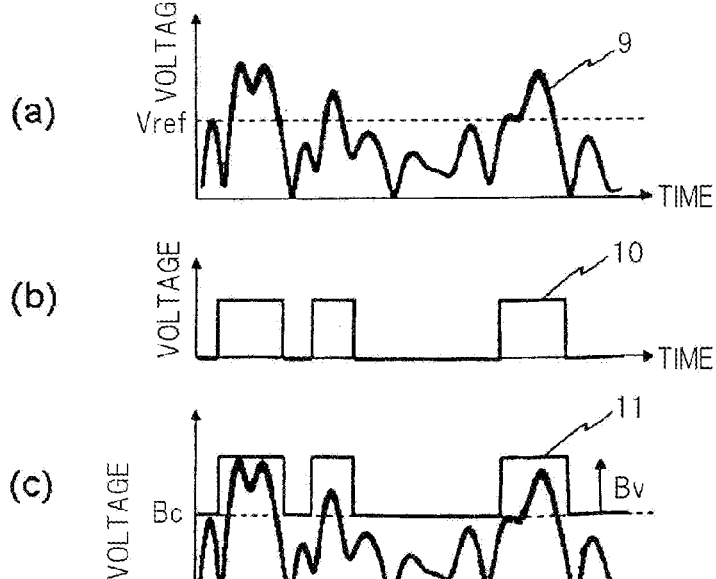
FIG. 2 is a signal waveform diagram showing an operation of the power amplifying device according to the first related art reference.

In addition, the power amplifying device according to this exemplary embodiment can supply output voltage waveform 11 to which a DC voltage has been added and that is smoother than that of the power amplifying device according to the first related art reference shown in FIG. 1 to radio frequency amplifier 1. Thus, waveform distortion of modulation signal 12 that is outputted from radio frequency amplifier 1 can be decreased.

Moreover, since the power amplifying device according to this exemplary embodiment can use an MOS FET of source ground type as switching device 21 unlike that of the second related art reference and the amplitude of gate pulse signal 10 that is inputted to switching device 21 can be as low as several V, it can operate at high speed.

Figure 3:
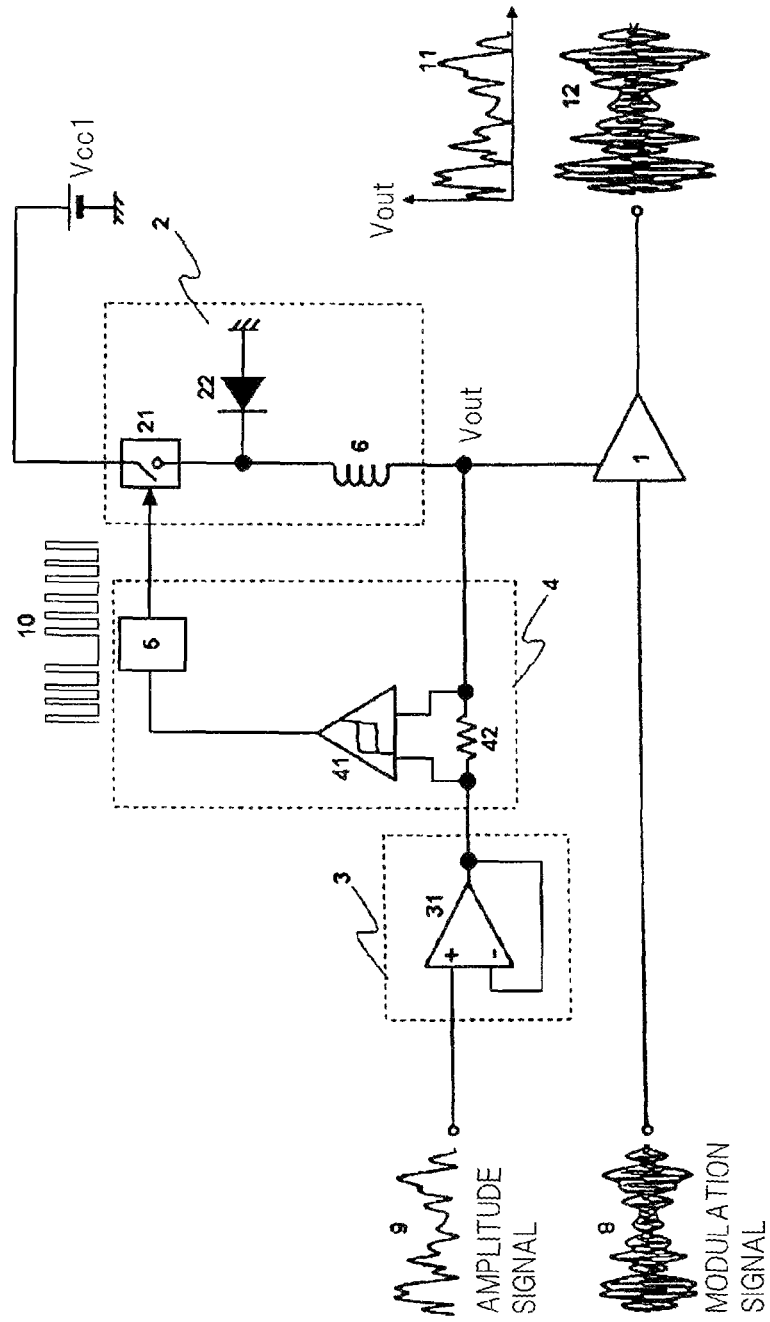
FIG. 3 is a block diagram showing a structure of a power amplifying device according to a second related art reference
Figure 4:
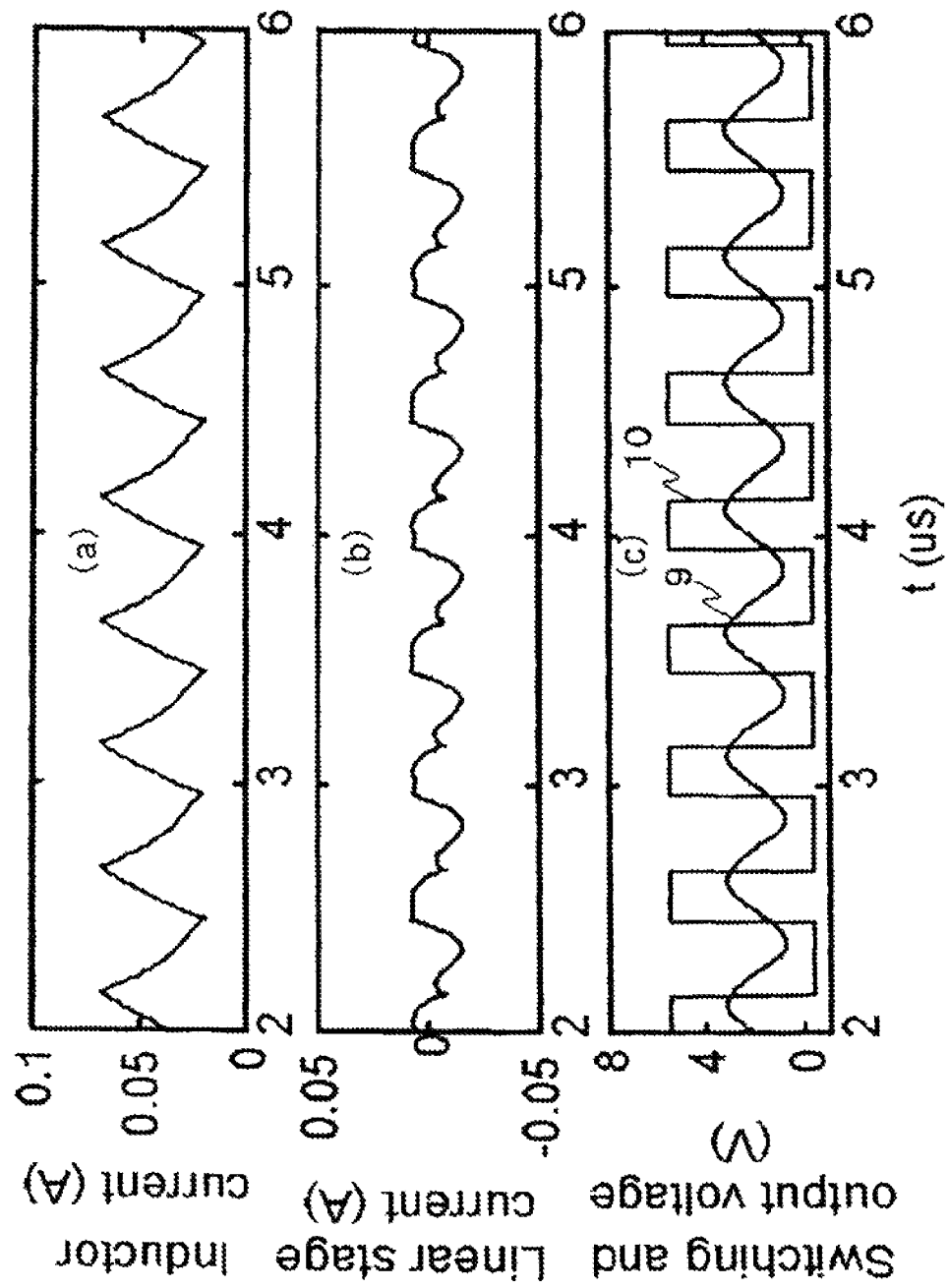
FIG. 4 is a signal waveform diagram showing an operation of the power amplifying device according to the second related art reference.

It is clear that in the case in which a 2 MHz sine wave is inputted, the power amplifying device according to this exemplary embodiment has a higher switching frequency (FIG. 7 (c)) than does the power amplifying device according to the second related art reference (FIG. 3).

Thus, since the power amplifying device according to this exemplary embodiment widens the operational bandwidth of switching amplification with high efficient and decreases the load imposed on linear amplifier 31 with low efficient, it can operate with high efficient. Moreover, since the power amplifying device according to this exemplary embodiment performs switching amplification only for the amplitude modulation component from which the DC offset of the input signal has been removed and directly supplies the DC voltage component from the secondary winding side of the transformer to radio frequency amplifier 1, the power amplifying device according to this exemplary embodiment can realize a higher efficiency than can the power amplifying device according to the second related art reference.

Although FIG. 6 shows an exemplary structure that adds a DC voltage to amplitude signal 9 through choke inductor 32, a DC voltage component may have been added to amplitude signal 9 by a signal process.

When the gain of linear amplifier 31 is 1, although the value of the DC voltage added to amplitude signal 9 ideally becomes the same as second power supply voltage Vcc2 supplied to the secondary winding of transformer 24, the value of the DC voltage may be adjusted based on an offset value or the like of each circuit.

In addition, linear amplifier 31 may be a linear feedback amplifier having a gain. In this case, the value of the DC voltage added to amplitude signal 9 may be decreased based on the value of the gain. Moreover, the winding ratio of transformer 24 may be designated as any value.

Figure 9:
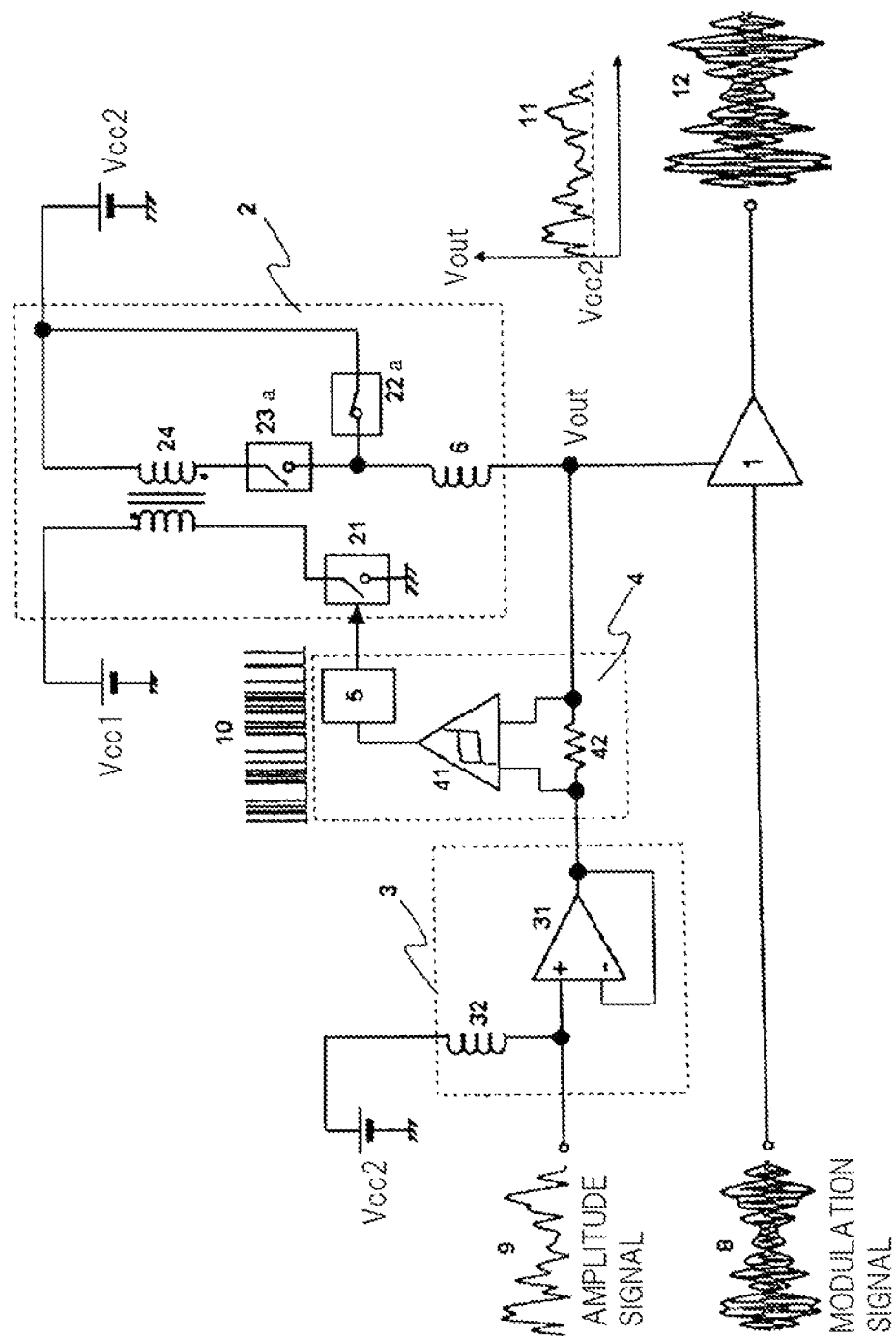
FIG. 9 is a circuit diagram showing another specific exemplary structure of the power amplifying device shown in FIG. 5.

FIG. 9 is a circuit diagram showing another specific exemplary structure of the power amplifying device shown in FIG. 5.

The power amplifying device shown in FIG. 9 is provided with switching device (first rectifying device) 22a and switching device (second rectifying device) 23a instead of diodes 22, 23 shown in FIG. 6 and has a structure that causes switching devices 22a, 23a to turn on/off in synchronization with control signal 10.

The power amplifying device shown in FIG. 9 operates in the same manner as the power amplifying device shown in FIG. 6 if switching device 22a is turned ON when control signal 11 becomes High and switching device 22a is turned OFF when control signal 11 becomes LOW and switching device 23a is turned ON when control signal 11 becomes High and switching device 23a is turned OFF when control signal 11 becomes LOW.

When switching devices 22a, 22a are used instead of diodes 22, 23, the efficiency of the power amplifying device is improved for a loss of the forward voltages of the diodes.

Figure 10:
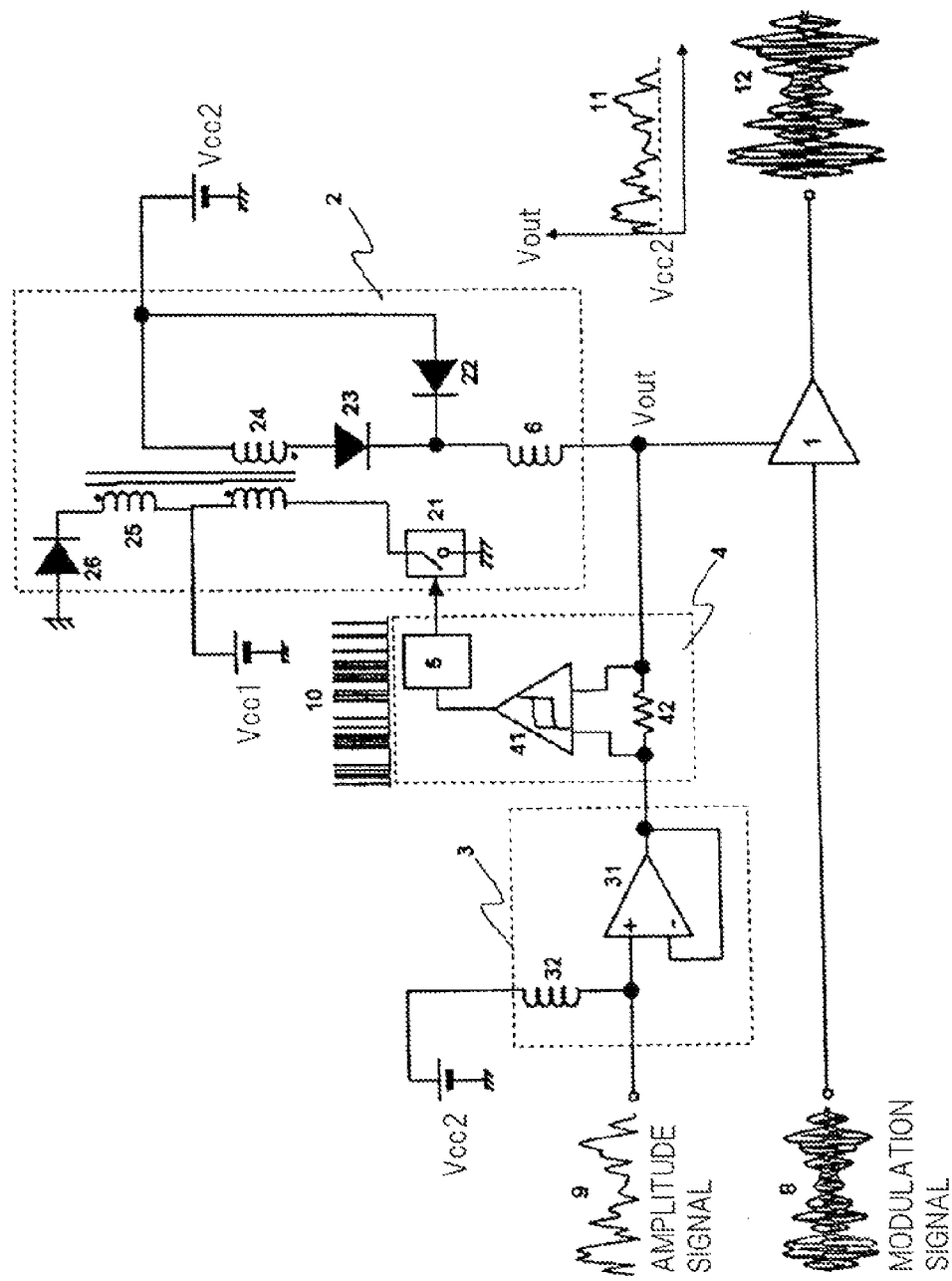
FIG. 10 is a circuit diagram showing another specific exemplary structure of the power amplifying device shown in FIG. 5.

FIG. 10 is a circuit diagram showing another specific exemplary structure of the power amplifying device shown in FIG. 5.

The power amplifying device shown in FIG. 10 has a structure that is provided with power regeneration circuit 25 that collects an electromagnetic current and that is disposed on the primary winding of transformer 24 shown in FIG. 6.

In the structure shown in FIG. 6, when switching device 21 is turned off (disconnected), since an exciting current that has flown in transformer 24 cannot flow, the exciting current is consumed by a capacitor and a resistance snubber circuit is connected to a power supply and so forth, resulting in occurrence of a loss.

When switching device 21 is turned off, power regeneration circuit 25 absorbs a current equivalent to the exciting current from a grounding terminal through diode 26 and regenerates it in first power supply Vcc1. When provided with power regeneration circuit 25, since no loss of the exciting current arises, the efficiency of switching amplifying section 2 improves. It is clear that power regeneration circuit 25 shown in FIG. 10 and the structure that uses switching devices 22a, 23a shown in FIG. 9 can be simultaneously used.

Second Exemplary Embodiment

Next, with reference to drawings, a power amplifying device according to a second exemplary embodiment will be described.

Figure 11:
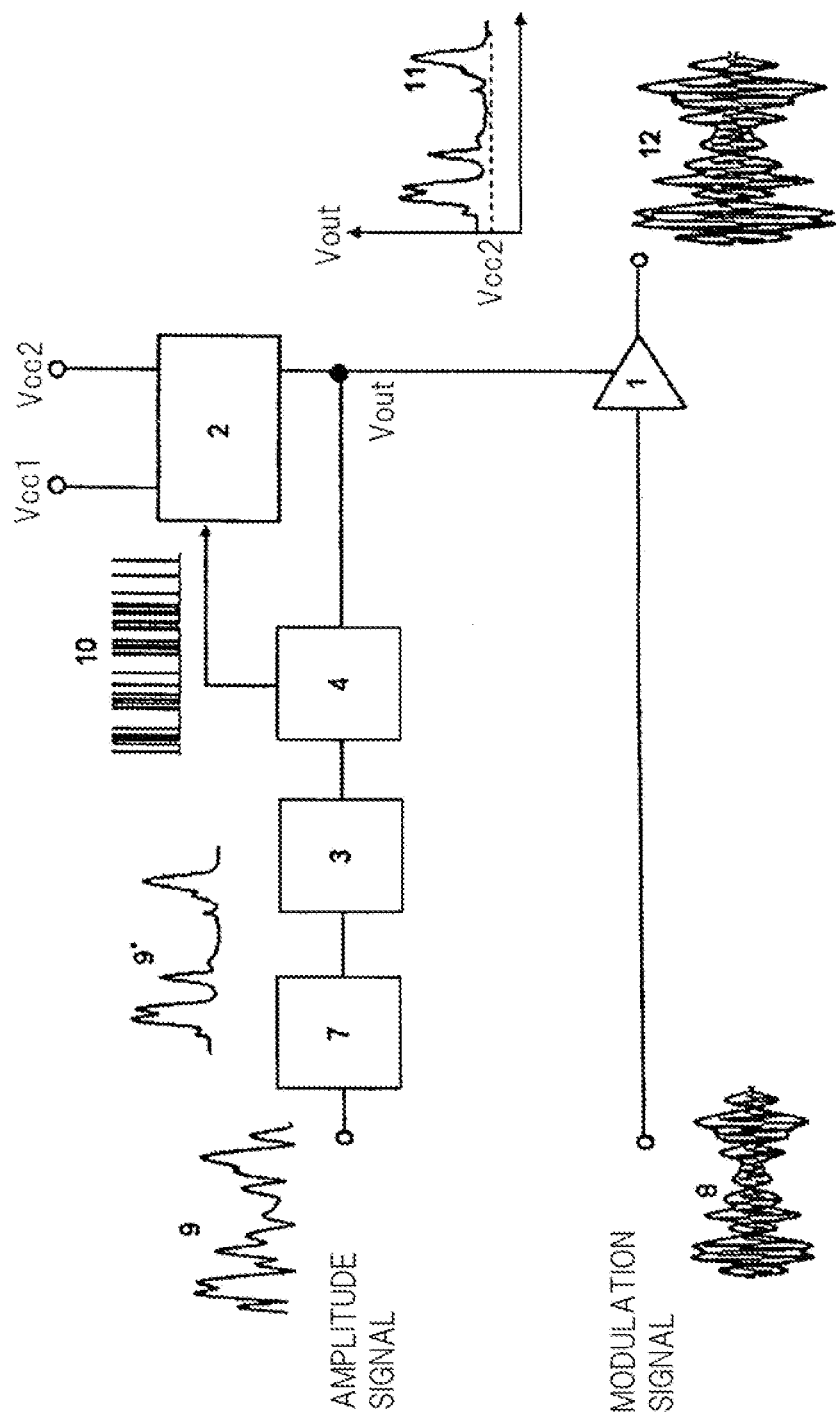
FIG. 11 is a block diagram showing a structure of a power amplifying device according to a second exemplary embodiment.

FIG. 11 is a block diagram showing a structure of the power amplifying device according to the second exemplary embodiment.

As shown in FIG. 11, the power amplifying device according to the second exemplary embodiment is provided with radio frequency amplifier 1, switching amplifying section 2, linear amplifying section 3, control signal generation section 4, and waveform trimming section 7.

In the power amplifying device shown in FIG. 11, amplitude signal 9 that is an amplitude modulation component of modulation signal 8 is inputted to waveform trimming section 7.

Waveform trimming section 7 performs waveform trimming by compressing the dynamic range of the amplitude variation of amplitude signal 9 that has been inputted and thereby generating a DC voltage component and then outputs the resultant signal to linear amplifying section 3.

Linear amplifying section 3 linearly amplifies amplitude signal 9 that is an amplitude modulation component of modulation signal 8.

Control signal generation section 4 generates a pulse modulation signal that becomes High or Low depending on the direction of the output current of linear amplifying section 3 and outputs the pulse modulation signal as a control signal to switching amplifying section 2.

Switching amplifying section 2 performs switching amplification for amplitude signal 9 based on a control signal that is outputted from control signal generation section 4, adds a predetermined DC voltage to the amplified signal, and outputs the resultant signal. The output voltage of switching amplifying section 2 is added to the output voltage of control signal generation section 4 and thereby modulation voltage 11 is generated as a power supply voltage supplied to radio frequency amplifier 1.

Radio frequency amplifier 1 linearly amplifies modulation signal 8 according to the class A system or class AB system using voltage 11 as a power supply and outputs radio frequency modulation signal 12 which has been modulated with respect to amplitude and phase.

Figure 12:
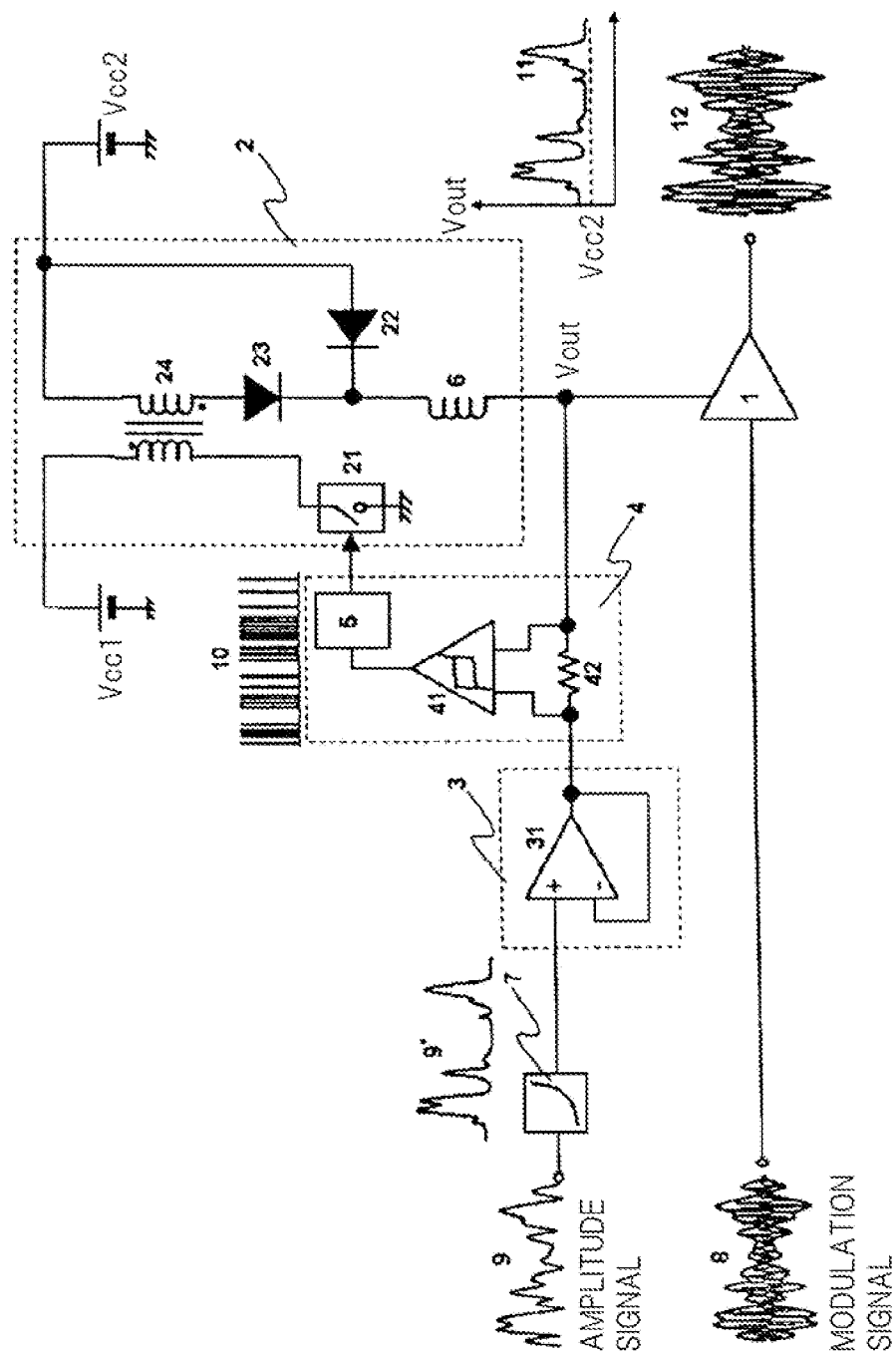
FIG. 12 is a circuit diagram showing a specific exemplary structure of the power amplifying device shown in FIG. 11.

FIG. 12 is a circuit diagram showing a specific exemplary structure of the power amplifying device shown in FIG. 11.

As shown in FIG. 12, switching amplifying section 2 is provided with switching device 21, transformer 24, diode (first rectifying device) 22, diode (second rectifying device) 23, and inductor (filter) 6.

On the other hand, linear amplifying section 3 is provided with linear amplifier 31. Control signal generation section 4 is provided with hysteresis comparator 41, current detection resistor 42, and gate driver 5.

Waveform trimming section 7 is provided with voltage waveform trimming section 7.

Figure 13:
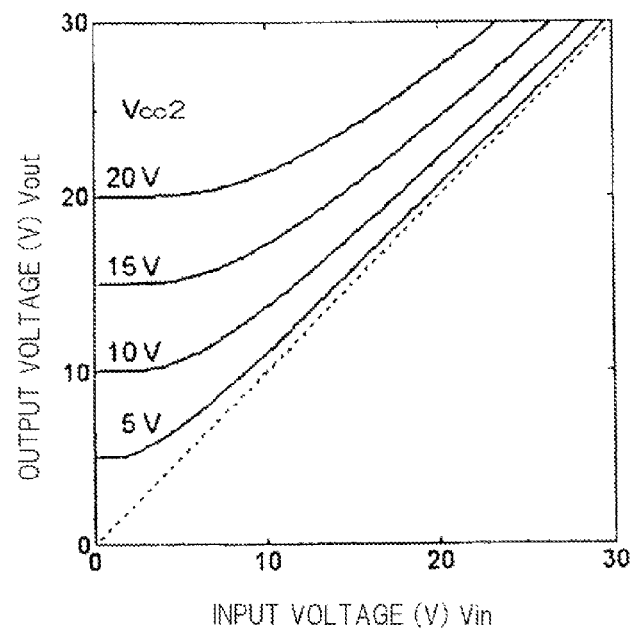
FIG. 13 is a graph showing an exemplary waveform trimming function used in a voltage wavelength trimming section shown in FIG. 12.
Figure 14:
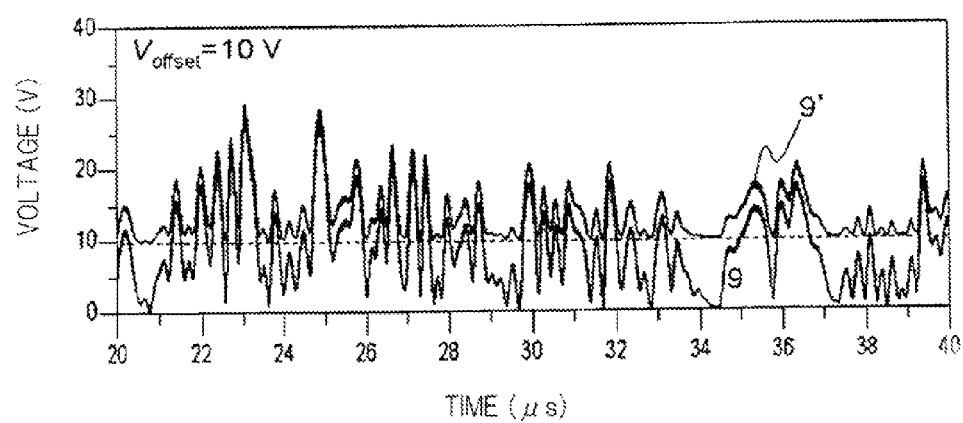
FIG. 14 is a signal waveform diagram showing an exemplary after-trimmed waveform by using the voltage waveform trimming section shown in FIG. 12.
Figure 15:
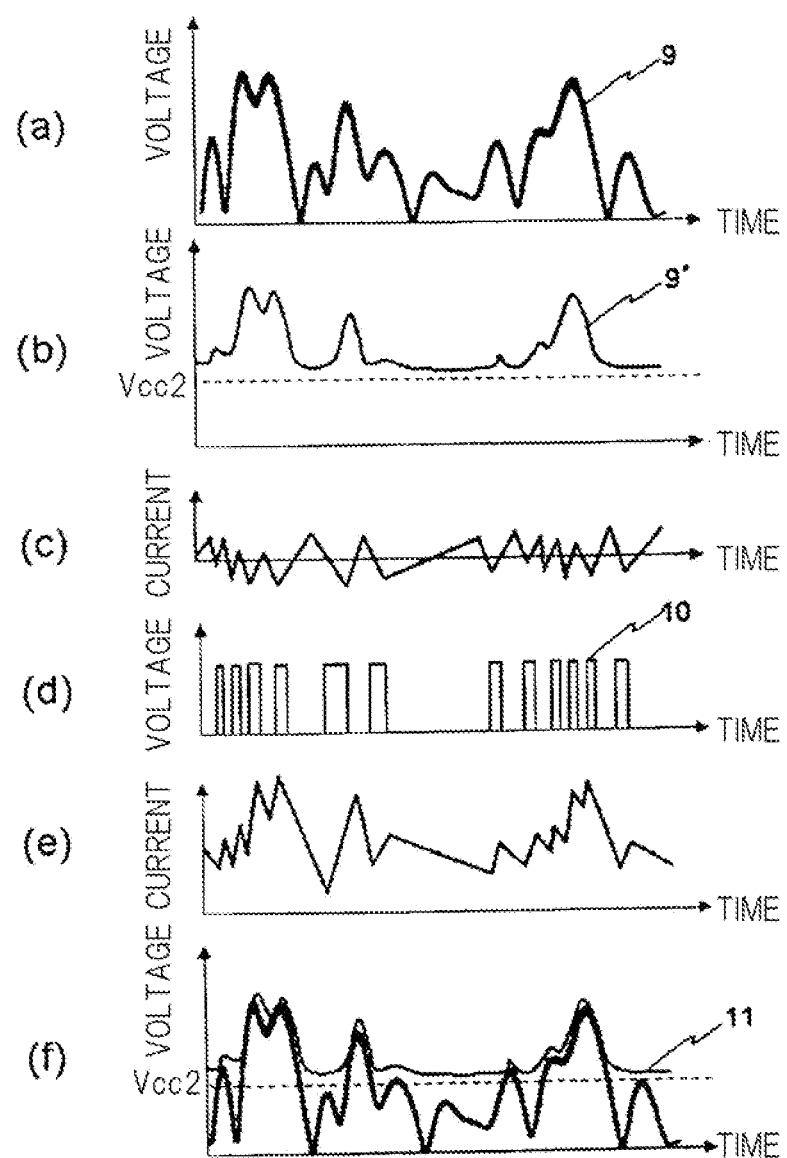
FIG. 15 is a signal waveform diagram showing an exemplary operation of the power amplifying device shown in FIG. 12.

FIG. 13 is a graph showing an exemplary waveform trimming function that the voltage waveform trimming section shown in FIG. 12 uses. On the other hand, FIG. 14 is a signal waveform diagram showing an exemplary waveform after trimming is performed by using the voltage waveform trimming section shown in FIG. 12. FIG. 15 is a signal waveform diagram showing an exemplary operation of the power amplifying device sown in FIG. 12. FIG. 11 and FIG. 12 show exemplary operational waveforms in the case in which an envelop signal (amplitude signal) of a downlink signal that a radio device according to the WCDMA system receives is inputted.

Next, with reference to FIG. 12 to FIG. 15, an operation of the power amplifying device according to the second exemplary embodiment will be described.

As shown in FIG. 12, amplitude signal 9 that is an amplitude modulation component of modulation signal 8 that has been modulated with respect to amplitude and phase is inputted to waveform trimming section 7 (FIG. 15 (a)).

Waveform trimming section 7 converts amplitude signal 9 according to, for example, a function given by the following formula (1).

[Expression 1]

$$V_{out} = V_{cc2} + V_{in}\left[-\frac{V_{cc2}}{V_{in}}\right] \quad (1)$$

FIG. 13 represents the relationship between input and output signals converted by the function given by formula (1) and shows curves that vary when the value of the DC voltage $V_{cc2}$ is changed to 5, 10, 15, and 20 V. FIG. 14 shows an example in which in the case of $V_{cc2}$=10 V, the waveform of amplitude signal 9 that is inputted is trimmed according to the function given by the foregoing formula (1).

As shown in FIG. 14, amplitude signal 9' whose waveform hat has been trimmed is a signal in which a large amplitude modulation component is outputted, as is, and a low amplitude modulation component is compressed and a DC voltage of $V_{cc2}$=10 V is added to the compressed signal.

Linear amplifying section 3 according to the second exemplary embodiment linearly amplifies amplitude signal 9' whose waveform has been trimmed and outputted from waveform trimming section 7 (FIG. 15 (b)).

Thereafter, the power amplifying device according to this exemplary embodiment performs the same process as does the power amplifying device according to the first exemplary embodiment shown in FIG. 5 to FIG. 8.

An output current (FIG. 15 (c)) of linear amplifier 31 is converted into a voltage signal by current detection resistor 42 and inputted to hysteresis comparator 41. When polarities are selected in such a manner that the output voltage of hysteresis comparator 41 becomes High when the current flows from linear amplifier 31 and the output voltage of hysteresis comparator 41 becomes Low when the current flows to linear amplifier 31, a pulse width modulation signal according to the intensity of the input signal is outputted from hysteresis comparator 41 (FIG. 15 (d)).

Gate driver 5 turns on or off switching device 21 composed of for example an MOS FET based on the output signal of hysteresis comparator 41.

One terminal of switching device 21 is grounded, whereas the other terminal is connected to first power supply Vcc1 through the primary winding of transformer 24. Switching device 21 controls connection/disconnection of a current that flows between first power supply Vcc1 and a ground potential based on the output signal of hysteresis comparator 41 so as to amplify the amplitude of the output signal of hysteresis comparator 41 to Vcc1.

The signal amplified by switching device 21 is transferred from the primary winding to the secondary winding of transformer 24. Since DC voltage Vcc2 generated by a second power supply is applied to one terminal of the secondary winding of transformer 24, a signal of which DC voltage Vcc2 has been added to the pulse signal of amplitude Vcc1 is outputted from the secondary winding of transformer 24.

A current based on the pulse signal is supplied from the second power supply to the secondary winding of transformer 24. At this point, currents are outputted alternately from rectifying device 22 and rectifying device 23 depending on whether the pulse signal becomes High/Low by rectifying operations of rectifying device 22 and rectifying device 23. Since a pulse-shaped current flows in the secondary winding of transformer 24, the characteristic of switching amplification with high efficiency of switching device 21 is maintained on the secondary winding side of transformer 24. The current that is outputted from the secondary winding of transformer 24 is integrated by inductor 6 and thereby a switching frequency component is removed therefrom (FIG. 15 (e)).

In addition, a switching noise component contained in the output voltage of switching amplifying section 2 is compensated (smoothened) by linear amplifier 31 (FIG. 15 (f)).

As shown in FIG. 12, an output terminal of linear amplifier 31 is connected to an output terminal of switching amplifying section 2 and an output signal of linear amplifier 31 is negatively fed back thereto. Thus, since linear amplifier 31 operates such that the waveform of the output signal matches that of the input signal, a signal that cancels a switching noise contained in the output voltage of switching amplifying section 2 is outputted from linear amplifier 31. Thus, the switching noise contained in the output voltage of switching amplifying section 2 is smoothened by linear amplifier 31. At this point, although an output terminal of linear amplifier 31 is connected to the output terminal of switching amplifying section 2 through current detection resistor 42, since the value of current detection resistor 42 is small, it hardly affects the voltage compensation operation.

Voltage Vout that has been compensated by linear amplifier 31 is supplied to radio frequency amplifier 1. Radio frequency amplifier 1 linearly amplifies modulation signal 8 that has been inputted based on the output voltage of switching amplifying section 2 as a power supply voltage. At this point, since a minimum power (power supply voltage) is supplied to radio frequency amplifier 1 based on the amplitude of amplitude signal 9, radio frequency amplifier 1 can nearly always operate with a saturation power having high efficiency.

In the power amplifying device according to this exemplary embodiment, as shown in FIG. 15 (c), since a current that flows in linear amplifier 31 with low efficiency contains only a switching noise component, the power consumed in linear amplifier 31 is small and thereby the efficiency of the entire power amplification device can be improved.

In addition, the power amplifying device according to this exemplary embodiment can supply output voltage waveform 11 to which a DC voltage has been added and that is smoother than that of the power amplifying device according to the first related art reference shown in FIG. 1 to radio frequency amplifier 1. Thus, waveform distortion of modulation signal 12 that is outputted from radio frequency amplifier 1 can be decreased.

Moreover, since the power amplifying device according to this exemplary embodiment can use an MOS FET of source ground type as switching device 21, unlike that of the second related art reference, and the amplitude of gate pulse signal 10 that is inputted to switching device 21 can be as low as several V, it can operate at high speed.

Thus, since the power amplifying device according to this exemplary embodiment widens the operational bandwidth of switching amplification with high efficient and decreases the load imposed on linear amplifier 31 with low efficiency, it can operate with high efficiency. Moreover, since the power amplifying device according to this exemplary embodiment performs switching amplification only for the amplitude modulation component from which the DC offset of the input signal has been removed and directly supplies the DC voltage component from the secondary winding side of the transformer to radio frequency amplifier 1, the power amplifying device according to this exemplary embodiment can accomplish higher efficiency than can the power amplifying device according to the second related art reference.

Furthermore, in the power amplifying device according to this exemplary embodiment, waveform trimming section 7 generates a DC voltage component in such a manner that a large amplitude modulation component contained in amplitude signal 9 is outputted, as is, and a small amplitude modulation component is compressed. Since waveform trimming is performed in such a manner, when the power amplifying device is caused to supply a voltage sufficiently larger than the large amplitude modulation component of amplitude signal 9 to radio frequency amplifier 1, and since a small amplitude modulation component of amplitude signal 9 can be covered by only the DC voltage component, waveform trimming section 7 barely supplies wasteful power to radio frequency amplifier 1 (FIG. 15 (f)).

Thus, the power amplifying device according to this exemplary embodiment can supply power to radio frequency amplifier 1 without any loss compared with the power amplifying device according to the first exemplary embodiment that equally shifts amplitude signal 9 by the DC voltage Vcc2 (FIG. 8 (e)).

In addition, since the power amplifying device according to this exemplary embodiment performs the foregoing waveform trimming, the bandwidth and dynamic range required for linear amplifier 31 and switching device 21 can be advantageously narrowed.

Moreover, the function used in waveform trimming section 7 is not limited to the foregoing formula (1); instead, the function may be changed depending on the signal to be amplified and the system for use.

When the gain of linear amplifier 31 is 1, although the value of the DC voltage component added to amplitude signal 9 by waveform trimming section 7 ideally becomes the same as second power supply voltage Vcc2 supplied to the secondary winding of transformer 24, the value of the DC voltage component may be adjusted based on an offset value or the like of each circuit.

In addition, linear amplifier 31 may be a linear feedback amplifier having a gain. In this case, the value of the DC voltage added to amplitude signal 9 may be decreased based on the value of the gain. Moreover, the winding ratio of transformer 24 may be designated as any value.

The power amplifying device shown in FIG. 12 is provided with switching device 22a and switching device 23a instead of diodes 22, 23 and has a structure that causes switching devices 22a, 23a to turn on/off in synchronization with control signal 10. When switching devices 22a, 22a are used instead of diodes 22, 23, the efficiency of the power amplifying device is improved for a loss of the forward voltages of the diodes.

The power amplifying device shown in FIG. 12 may be provided with power regeneration circuit 25 that collects the exciting current shown in FIG. 10. When provided with power regeneration circuit 25, since no loss of the exciting current occurs, the efficiency of switching amplifying section 2 improves.

Third Exemplary Embodiment

Next, with reference to drawings, a power amplifying device according to the third exemplary embodiment will be described.

Figure 16:
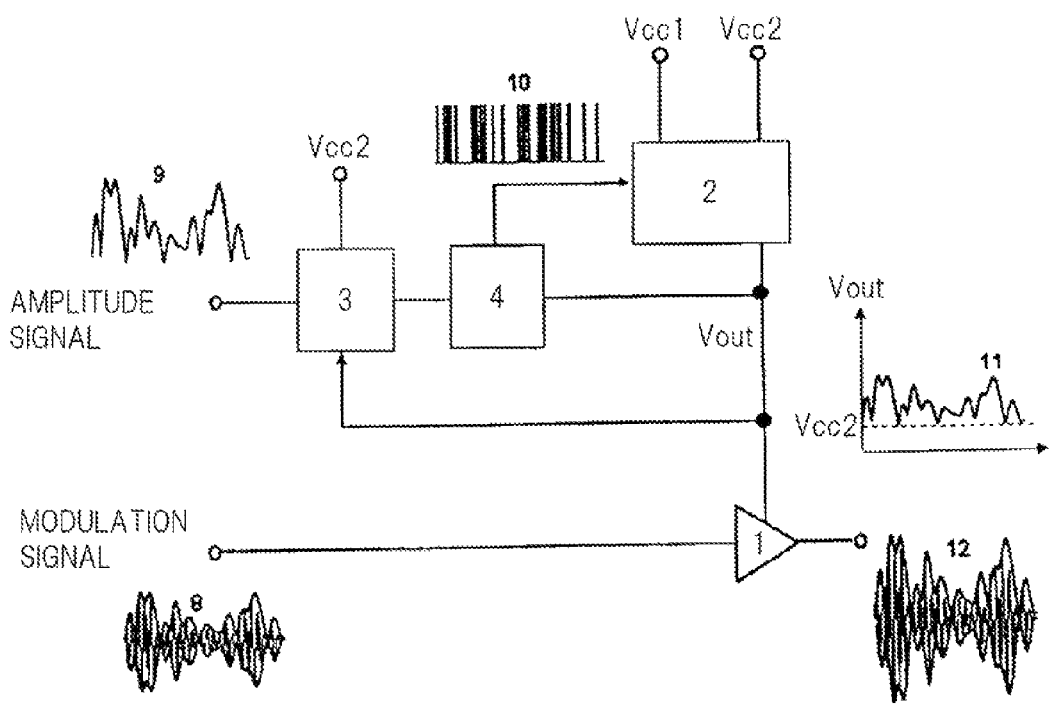
FIG. 16 is a block diagram showing a structure of a power amplifying device according to a third exemplary embodiment.

FIG. 16 is a block diagram showing a structure of the power amplifying device according to the third exemplary embodiment.

As shown in FIG. 16, the power amplifying device according to the third exemplary embodiment is provided with radio frequency amplifier 1, switching amplifying section 2, linear amplifying section 3, and control signal generation section 4.

Linear amplifying section 3 adds a predetermined DC voltage to amplitude signal 9 that is an amplitude modulation component of modulation signal 8, adds the output voltage to a power supply voltage supplied to radio frequency amplifier 1, amplifies a difference between the output voltage and the amplitude modulation component of the modulation signal, and outputs the resultant signal.

Control signal generation section 4 generates a pulse modulation signal that becomes High or Low depending on the direction of the output current of linear amplifying section 3 and outputs the pulse modulation signal to switching amplifying section 2.

Switching amplifying section 2 performs switching amplification for amplitude signal 9 based on the pulse modulation signal as a control signal that is outputted from control signal generation section 4, adds a predetermined DC voltage to the amplified signal, and outputs the resultant signal. The output voltage of switching amplifying section 2 is added to the output voltage of control signal generation section 4 and thereby modulation voltage 11 is generated as a power supply voltage supplied to radio frequency amplifier 1.

Radio frequency amplifier 1 linearly amplifies modulation signal 8 according to the class A system or class AB system based on modulation voltage 11 as a power supply and outputs radio frequency modulation signal 12 which has been modulated with respect to amplitude and phase.

A power supply voltage supplied to radio frequency amplifier 1 is negatively fed back to linear amplifying section 3 according to this exemplary embodiment.

Radio frequency amplifier 1 linearly amplifies modulation signal 8 according to the class A system or class AB system based on modulation voltage 11 as a power supply and outputs radio frequency modulation signal 12 which has been modulated with respect to amplitude and phase.

Figure 17:
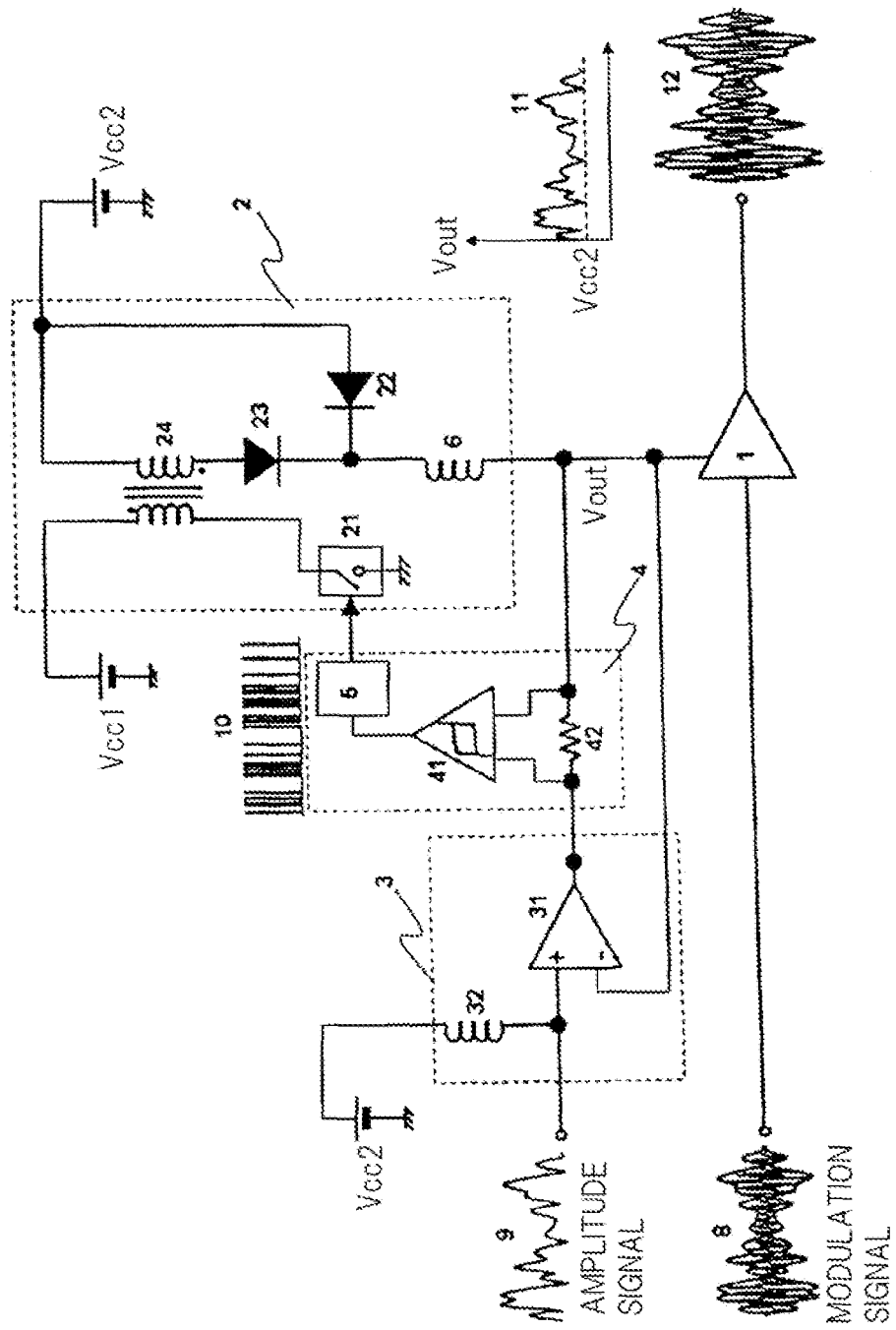
FIG. 17 is a circuit diagram showing a specific exemplary structure of the power amplifying device shown in FIG. 16.

FIG. 17 is a circuit diagram showing a specific exemplary structure of the power amplifying device shown in FIG. 16.

As shown in FIG. 17, switching amplifying section 2 is provided with switching device 21, transformer 24, diode (first rectifying device) 22, diode (second rectifying device) 23, and inductor (filter) 6.

On the other hand, linear amplifying section 3 is provided with linear amplifier 31 and choke inductor 32. Control signal generation section 4 is provided with hysteresis comparator 41, current detection resistor 42, and gate driver 5.

Next, with reference to FIG. 17, an operation of the power amplifying device according to the third exemplary embodiment will be described.

As shown in FIG. 17, amplitude signal 9 that is an amplitude modulation component of modulation signal 8 that has been modulated with respect to amplitude and phase is inputted to linear amplifying section 3.

A DC voltage of Vcc2=12 V is added to amplitude signal 9 through choke inductor 32 and then inputted to linear amplifier 31.

An output current of linear amplifier 31 is converted into a voltage signal by current detection resistor 42 and then inputted to hysteresis comparator 41. If polarities are selected such that when the current flows from linear amplifier 31, the output voltage of hysteresis comparator 41 becomes High and when the current flows to linear amplifier 31, the output voltage of hysteresis comparator 41 becomes Low, a pulse width modulation signal corresponding to the intensity of the input signal is outputted from hysteresis comparator 41.

Gate driver 5 turns on or off switching device 21 composed of, for example, an MOS FET based on the output signal of hysteresis comparator 41.

One terminal of switching device 21 is grounded, whereas the other terminal is connected to first power supply Vcc1 through the primary winding of transformer 24. Switching device 21 controls connection/disconnection of a current that flows between first power supply Vcc1 and a ground potential based on the output signal of hysteresis comparator 41 so as to amplify the amplitude of the output signal of hysteresis comparator 41 to Vcc1.

In this example, since a voltage is not applied to both terminals of switching device 21 while a current is flowing, switching device 21 amplifies the output signal of hysteresis comparator 41 ideally with an efficiency of 100%.

The signal amplified by switching device 21 is transferred from the primary winding to the secondary winding of transformer 24. Since DC voltage Vcc2 generated by a second power supply has been applied to one terminal of the secondary winding of transformer 24, a signal in which DC voltage Vcc2 has been added to the pulse signal of amplitude Vcc1 is outputted from the secondary winding of transformer 24.

A current based on the pulse signal is supplied from the second power supply to the secondary winding of transformer 24. At this point, currents are outputted alternately from rectifying device 22 and rectifying device 23 depending on whether the pulse signal becomes High/Low by rectifying operations of rectifying device 22 and rectifying device 23. Since a pulse-shaped current flows in the secondary winding of transformer 24, the characteristic of switching amplification with high efficiency of switching device 21 is maintained on the secondary winding side of transformer 24. The current that is outputted from the secondary winding of transformer 24 is integrated by inductor 6 and thereby a switching frequency component is removed therefrom.

In addition, a switching noise component contained in the output voltage of switching amplifying section 2 is compensated (smoothened) by linear amplifier 31.

As shown in FIG. 17, in the power amplifying device according to this exemplary embodiment, the output signal of switching amplifying section 2 is negatively fed back to linear amplifier 31. Thus, since linear amplifier 31 operates such that the waveform of the output signal matches that of the input signal, a signal that cancels a switching noise contained in the output voltage of switching amplifying section 2 is outputted from linear amplifier 31. Thus, the switching noise contained in the output voltage of switching amplifying section 2 is smoothened by linear amplifier 31. At this point, since the output signal of switching amplifying section 2 is negatively fed back to linear amplifier 31, current detection resistor 42 less affects the voltage compensation than do that of the first exemplary embodiment and the second exemplary embodiment.

Voltage Vout that has been compensated by linear amplifier 31 is supplied to radio frequency amplifier 1. Radio frequency amplifier 1 linearly amplifies modulation signal 8 that has been inputted based on the output voltage of switching amplifying section 2 as a power supply voltage. At this point, since a minimum power (power supply voltage) is supplied to radio frequency amplifier 1 based on the amplitude of amplitude signal 9, radio frequency amplifier 1 can always operate nearly with a saturation power having high efficiency.

In the power amplifying device according to this exemplary embodiment, since a current that flows in linear amplifier 31 with low efficiency contains only a switching noise component, the power consumed in linear amplifier 31 is small and thereby the efficiency of the entire power amplification device can be improved.

In addition, the power amplifying device according to this exemplary embodiment can supply output voltage waveform 11 to which a DC voltage has been added and that is smoother than that of the power amplifying device according to the first related art reference shown in FIG. 1 to radio frequency amplifier 1. Thus, waveform distortion of modulation signal 12 that is outputted from radio frequency amplifier 1 can be decreased.

Moreover, since the power amplifying device according to this exemplary embodiment can use an MOS FET of source ground type as switching device 21, unlike that of the second related art reference, and the amplitude of gate pulse signal 10 that is inputted to switching device 21 can be as low as several V, it can operate at high speed.

Thus, since the power amplifying device according to this exemplary embodiment widens the operational bandwidth of switching amplification with highly efficiency and decreases the load imposed on linear amplifier 31 with low efficiency, it can operate with high efficiency. Moreover, since the power amplifying device according to this exemplary embodiment performs switching amplification only for the amplitude modulation component from which the DC offset of the input signal has been removed and directly supplies the DC voltage component from the secondary winding side of the transformer to radio frequency amplifier 1, the power amplifying device according to this exemplary embodiment can realize higher efficiency than can the power amplifying device according to the second related art reference.

In addition, the power amplifying device according to this exemplary embodiment negatively feeds back a power supply voltage supplied to radio frequency amplifier 1 to linear amplifier 31. Ordinarily, the input impedance of the power supply of radio frequency amplifier 1 is around several ohms. On the other hand, the value of current detection resistor 42, with which control signal generation section 4 is provided, is around 0.5Ω and takes around 10% of the input impedance of the power supply of radio frequency amplifier 1.

As an ideal condition of a power supply, the output impedance needs to be sufficiently lower than the load impedance. In other words, the power supply needs to always stably supply the same voltage even if the load fluctuates.

According to this exemplary embodiment, since the power supply voltage supplied to radio frequency amplifier 1 is negatively fed back to linear amplifier 31, the waveform of the power supply voltage supplied to radio frequency amplifier 1 always becomes equal to that of amplitude signal 9. In other words, the output impedance of the modulation power supply that supplies power (power supply voltage) to radio frequency amplifier 1 is not affected by current detection resistor 42 with which control signal generation section 4 is provided. Thus, since the output impedance of the modulation power supply becomes close to 0, the power amplifying device operates as a more ideal voltage source.

Although FIG. 17 shows an exemplary structure that adds a DC voltage to amplitude signal 9 through choke inductor 32, a DC voltage component may have been added to amplitude signal 9 by a signal process.

When the gain of linear amplifier 31 is 1, although the value of the DC voltage added to amplitude signal 9 ideally becomes the same as second power supply voltage Vcc2 supplied to the secondary winding of transformer 24, the value of the DC voltage may be adjusted based on an offset value or the like of each circuit.

In addition, linear amplifier 31 may be a linear feedback amplifier having a gain. In this case, the value of the DC voltage added to amplitude signal 9 may be decreased based on the value of the gain. Moreover, the winding ratio of transformer 24 may be designated as any value.

The power amplifying device shown in FIG. 17 is provided with switching devices 22a, 23a instead of diodes 22, 23 and has a structure that causes switching devices 22a, 23a to turn on/off in synchronization with control signal 10. When switching devices 22a, 22a are used instead of diodes 22, 23, the efficiency of the power amplifying device is improved for a loss of the forward voltages of the diodes.

The power amplifying device shown in FIG. 17 may be provided with power regeneration circuit 25 that collects the exciting current shown in FIG. 10. When the power amplifying device includes power regeneration circuit 25, since no loss of the exciting current occurs, the efficiency of switching amplifying section 2 improves.

Now, with reference to the exemplary embodiments, the present invention has been described. However, it should be understood by those skilled in the art that the structure and details of the present invention may be changed in various manners without departing from the scope of the present invention.

The present application is the National Phase of PCT/JP2009/070949, filed Dec. 16, 2009, which claims priority based on Japanese Patent Application No. 2008-330709 filed on Dec. 25, 2008, the entire contents of which are incorporated herein by reference in its entirety.

The invention claimed is:

1. A power amplifying device that amplifies a modulation signal containing an amplitude modulation component and a phase modulation component, comprising:
   a radio frequency amplifier that amplifies said modulation signal and outputs the resultant signal;
   a linear amplifying section that adds an output voltage to a power supply voltage supplied to said radio frequency amplifier, amplifies a difference between the output voltage and the amplitude modulation component of said modulation signal, and outputs the resultant difference;
   a control signal generation section that detects a direction in which an output current of said linear amplifying section flows and generates a pulse modulation signal according to the direction of the current;
   a switching amplifying section that controls connection and disconnection of a DC current based on said pulse modulation signal as a control signal so as to perform switching amplification for an output signal of said linear amplifying section, to add the resultant signal to a predetermined DC voltage, and to supply the resultant signal as said power supply voltage to said radio frequency amplifier;
   a first DC power supply that supplies said DC current to said switching amplifying section; and
   a second DC power supply that supplies said predetermined DC voltage to said switching amplifying section.

2. A power amplifying device that amplifies a modulation signal containing an amplitude modulation component and a phase modulation component, comprising:
   a radio frequency amplifier that amplifies said modulation signal and outputs the resultant signal;
   a voltage waveform trimming section that forms a voltage waveform of the amplitude modulation component of said modulation signal;
   a linear amplifying section that adds an output voltage to a power supply voltage supplied to said radio frequency amplifier, amplifies a difference between the output voltage and the amplitude modulation component of said modulation signal, and outputs the resultant difference;
   a control signal generation section that detects a direction in which an output current of said linear amplifying section flows and generates a pulse modulation signal according to the direction of the current;
   a switching amplifying section that controls connection and disconnection of a DC current based on said pulse modulation signal as a control signal so as to perform switching amplification for an output signal of said linear amplifying section, to add the resultant signal to a predetermined DC voltage, and to supply the resultant signal as said power supply voltage to said radio frequency amplifier;
   a first DC power supply that supplies said DC current to said switching amplifying section; and
   a second DC power supply that supplies said predetermined DC voltage to said switching amplifying section.

3. The power amplifying device according to claim 1, wherein said switch amplifying section includes:
a transformer including a primary winding and a secondary winding, one end of the primary winding being connected to said first DC power supply, one end of the secondary winding being connected to said second DC power supply;
a switching device connected to another end of the primary winding of said transformer;
a first rectifying device connected to another end of the secondary winding of said transformer;
a second rectifying device connected between said second DC power supply and an output terminal of said first rectifying device; and
a filter that smoothens output currents of said first rectifying device and second rectifying device.

4. The power amplifying device according to claim 3, wherein at least one device from among said first rectifying device and said second rectifying device is a diode.

5. The power amplifying device according to claim 3, wherein at least one device from among said first rectifying device and said second rectifying device is a switching device that is controlled to be on and off in synchronization with said pulse modulation signal.

6. The power amplifying device according to claim 1, wherein said linear amplifying section includes a differential amplifier that negatively feeds back a voltage of the output terminal of the linear amplifying section.

7. The power amplifying device according to claim 1, wherein said linear amplifying section is a differential amplifier that negatively feeds back the power supply voltage supplied to said radio frequency amplifier.

8. The power amplifying device according to claim 1, wherein said linear amplifying section adds a predetermined DC voltage to the amplitude modulation component of said modulation signal that is inputted and amplifies the resultant signal.

9. The power amplifying device according to claim 2, wherein said voltage waveform trimming section trims a waveform by compressing a dynamic range of amplitude variation of the amplitude modulation component of said modulation signal and by generating a DC voltage component.

10. The power amplifying device according to claim 1, wherein said control signal generation section includes:
a current detection resistor in which an output current of said linear amplifying section flows; and
a hysteresis comparator that determines the direction of the output current of said linear amplifying section based on a voltage generated on both ends of said current detection resistor and outputs the determined result as a pulse modulation signal.

11. The power amplifying device according to claim 2, wherein said switch amplifying section includes:
a transformer including a primary winding and a secondary winding, one end of the primary winding being connected to said first DC power supply, one end of the secondary winding being connected to said second DC power supply;
a switching device connected to another end of the primary winding of said transformer;
a first rectifying device connected to another end of the secondary winding of said transformer;
a second rectifying device connected between said second DC power supply and an output terminal of said first rectifying device; and
a filter that smoothens output currents of said first rectifying device and second rectifying device.

12. The power amplifying device according to claim 11, wherein at least one device from among said first rectifying device and said second rectifying device is a diode.

13. The power amplifying device according to claim 11, wherein at least one device from among said first rectifying device and said second rectifying device is a switching device that is controlled to be on and off in synchronization with said pulse modulation signal.

14. The power amplifying device according to claim 2, wherein said linear amplifying section includes a differential amplifier that negatively feeds back a voltage of the output terminal of the linear amplifying section.

15. The power amplifying device according to claim 2, wherein said linear amplifying section is a differential amplifier that negatively feeds back the power supply voltage supplied to said radio frequency amplifier.

16. The power amplifying device according to claim 2, wherein said linear amplifying section adds a predetermined DC voltage to the amplitude modulation component of said modulation signal that is inputted and amplifies the resultant signal.

17. The power amplifying device according to claim 2, wherein said control signal generation section includes:
a current detection resistor in which an output current of said linear amplifying section flows; and
a hysteresis comparator that determines the direction of the output current of said linear amplifying section based on a voltage generated on both ends of said current detection resistor and outputs the determined result as a pulse modulation signal.

* * * * *